(12) United States Patent
Tillotson et al.

(10) Patent No.: US 11,722,123 B2
(45) Date of Patent: Aug. 8, 2023

(54) ENHANCED THRUST FROM ION-PROPELLED SPACECRAFT VIA TETHERED ION BLOCKER

(71) Applicant: The Boeing Company, Chicago, IL (US)

(72) Inventors: Brian Tillotson, Kent, WA (US); Bailey Keakulina Eaton, Seattle, WA (US)

(73) Assignee: The Boeing Company, Chicago, IL (US)

( * ) Notice: Subject to any disclaimer, the term of this patent is extended or adjusted under 35 U.S.C. 154(b) by 1231 days.

(21) Appl. No.: 16/555,346

(22) Filed: Aug. 29, 2019

(65) Prior Publication Data
US 2021/0269177 A1    Sep. 2, 2021

(51) Int. Cl.
*G06N 10/00*    (2022.01)
*B64G 1/40*    (2006.01)
(Continued)

(52) U.S. Cl.
CPC ............. *H03H 9/564* (2013.01); *B64G 1/405* (2013.01); *B64G 1/648* (2013.01); *B82Y 10/00* (2013.01);
(Continued)

(58) Field of Classification Search
CPC ........... B64G 1/648; B64G 1/405; B64G 1/54
See application file for complete search history.

(56) References Cited

U.S. PATENT DOCUMENTS

| | | | |
|---|---|---|---|
| 6,419,191 B1 * | 7/2002 | Hoyt ..................... | B64G 1/648 244/166 |
| 6,732,978 B2 * | 5/2004 | Ockels ................... | B64G 1/405 244/171.1 |

(Continued)

FOREIGN PATENT DOCUMENTS

| | | |
|---|---|---|
| EP | 3375714 A1 | 9/2018 |
| FR | 2838102 A1 | 10/2003 |

OTHER PUBLICATIONS

"The Space Tether Experiment", Retrieved from the Internet on Aug. 20, 2019: https://www-istp.gsfc.nasa.gov/Education/wtether.html, 2 pgs.

(Continued)

*Primary Examiner* — Richard Green
*Assistant Examiner* — Madison Elizabeth Dittner
(74) *Attorney, Agent, or Firm* — Kwan & Olynick LLP

(57) ABSTRACT

Provided are various spacecraft propulsion systems, and associated methods of operation. A spacecraft comprises an ion propulsion system and an ion blocker suspended from the spacecraft via one or more electrically insulated tethers. The ion propulsion system is configured to generate a first propulsive force by emitting a charged ion beam in a direction with an ion velocity vector comprising an ion vector component that is perpendicular to a magnetic field of a planet, such as Earth. The magnetic field causes the ion beam to curve toward the ion blocker at a trajectory such that ions within the ion beam are blocked by the ion blocker to generate a second propulsive force on the ion blocker. The (Continued)

ion blocker blocks the ions by contacting or deflecting the ions. The ion blocker is positioned approximately twice the gyroradius of the ion beam trajectory.

20 Claims, 21 Drawing Sheets

(51) Int. Cl.
| | |
|---|---|
| *B64G 1/64* | (2006.01) |
| *H03H 9/56* | (2006.01) |
| *B82Y 10/00* | (2011.01) |
| *H01L 27/18* | (2006.01) |
| *H01L 39/02* | (2006.01) |
| *H01L 39/22* | (2006.01) |
| *H01L 39/24* | (2006.01) |
| *H01L 49/00* | (2006.01) |
| *H03H 9/17* | (2006.01) |
| *H03K 19/195* | (2006.01) |

(52) U.S. Cl.
CPC ............ *G06N 10/00* (2019.01); *H01L 27/18* (2013.01); *H01L 39/025* (2013.01); *H01L 39/223* (2013.01); *H01L 39/2493* (2013.01); *H01L 49/006* (2013.01); *H03H 9/171* (2013.01); *H03K 19/195* (2013.01)

(56) References Cited

U.S. PATENT DOCUMENTS

| | | | |
|---|---|---|---|
| 7,650,268 | B2 | 1/2010 | Tillotson |
| 8,210,480 | B2 * | 7/2012 | Moorer ................. F03H 1/0025 |
| | | | 244/158.6 |
| 10,583,939 | B2 * | 3/2020 | Williams ............... B64G 1/546 |
| 2006/0006324 | A1 | 1/2006 | Tillotson |
| 2020/0017240 | A1 * | 1/2020 | Carney .................. B64G 1/402 |
| 2022/0157551 | A1 * | 5/2022 | Ohkawa ................. B64G 1/648 |

OTHER PUBLICATIONS

Alpatov, A. et al; Determination of the force transmitted by an ion thruster plasma plume to an orbital object, Acta Astronautica, vol. 119, Nov. 27, 2015, pp. 241-251.

Andrews, Shaun et al.; Modelling and Characterisation of Plasmadynamic Drag on Gridded-Ion Propelled Spacecraft in Very Low Earth Orbit, Proceedings of the 69th International Astronautical Congress, Bremen, Germany, Oct. 1-5, 2018.

European Application Serial No. 20178241.4, Search Report dated Oct. 28, 2020, 9 pgs.

* cited by examiner

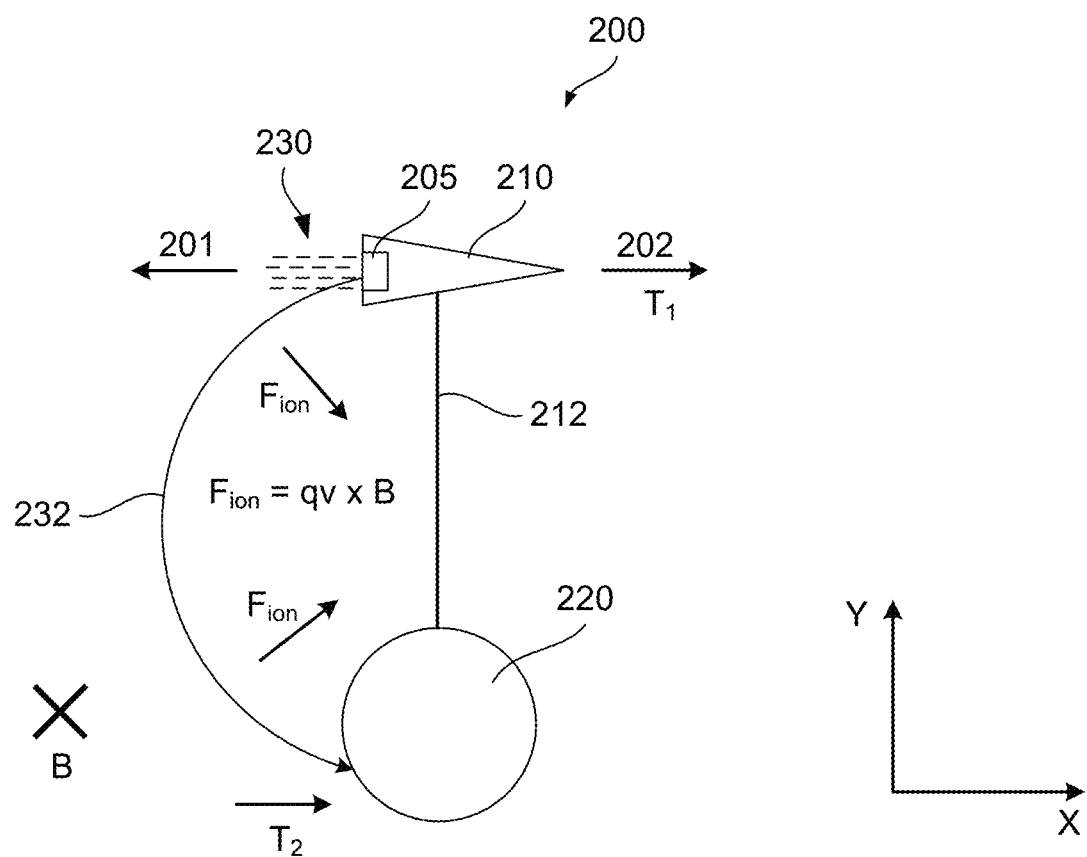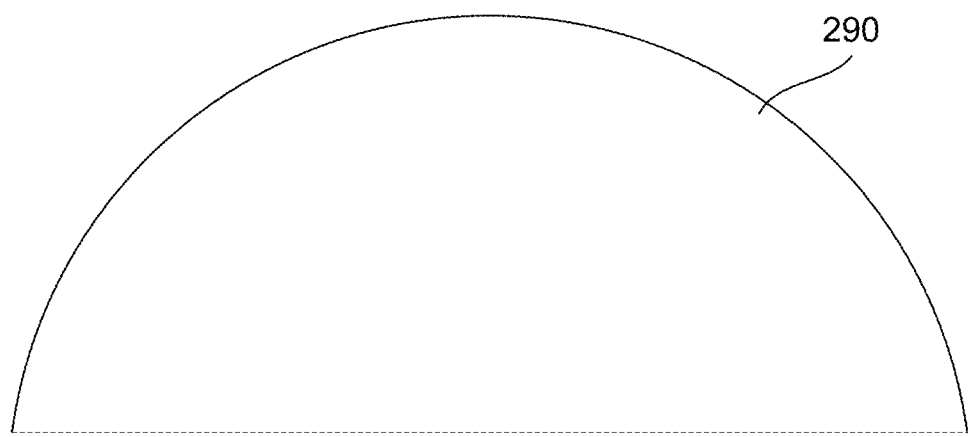
FIG. 2

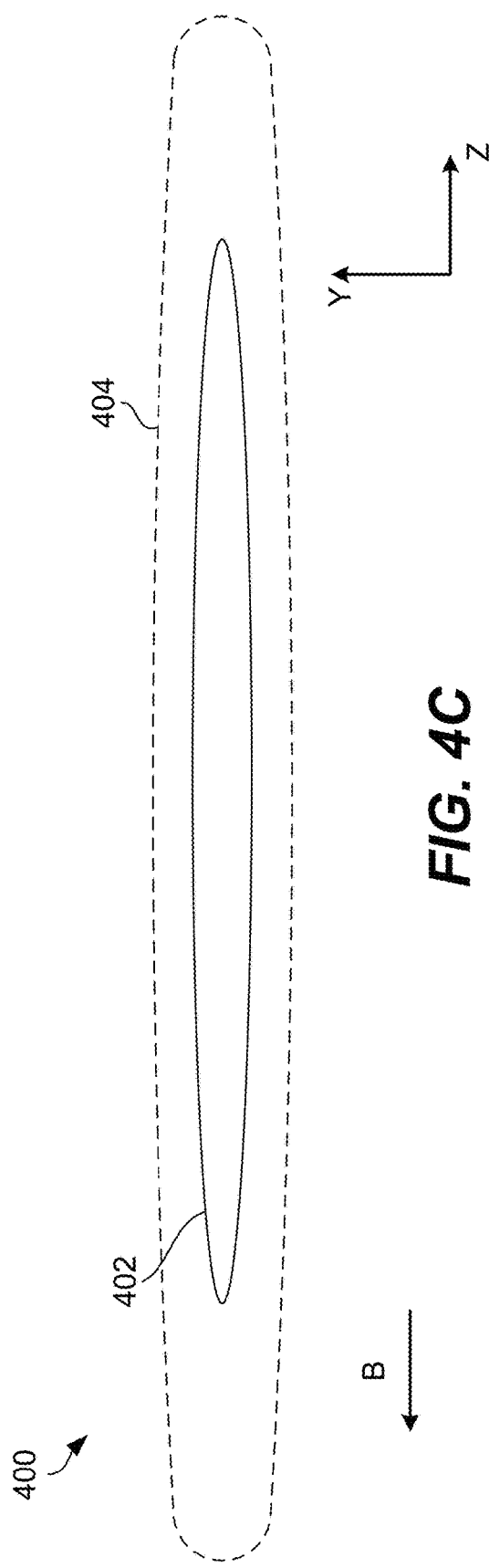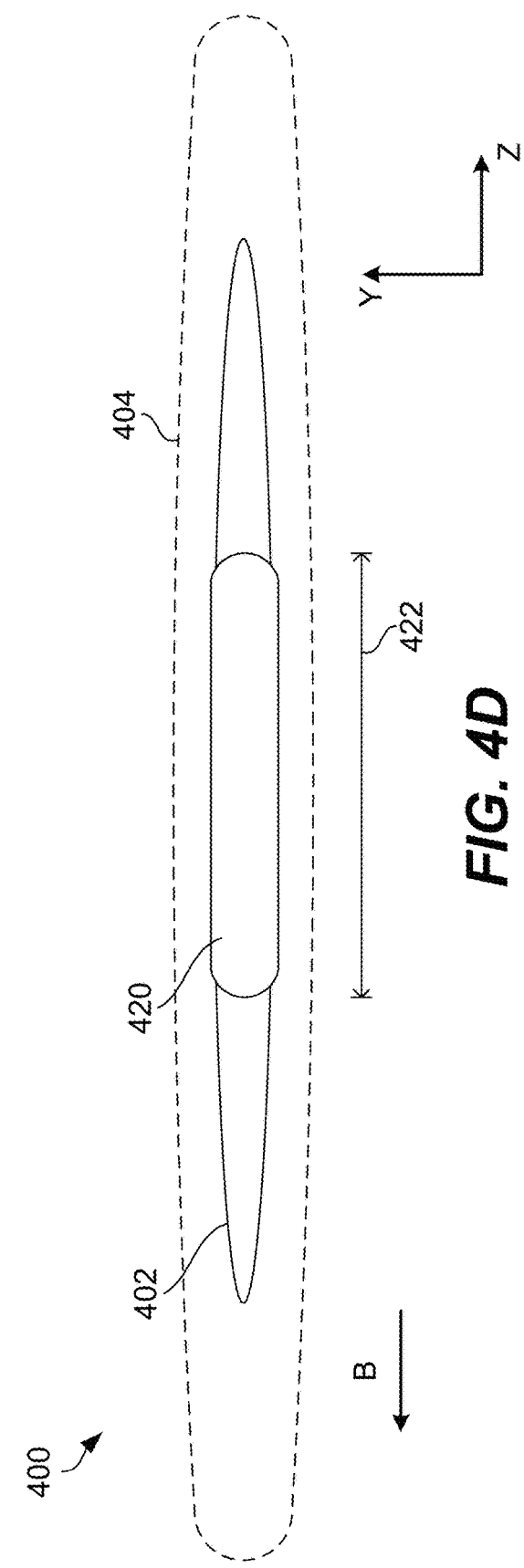

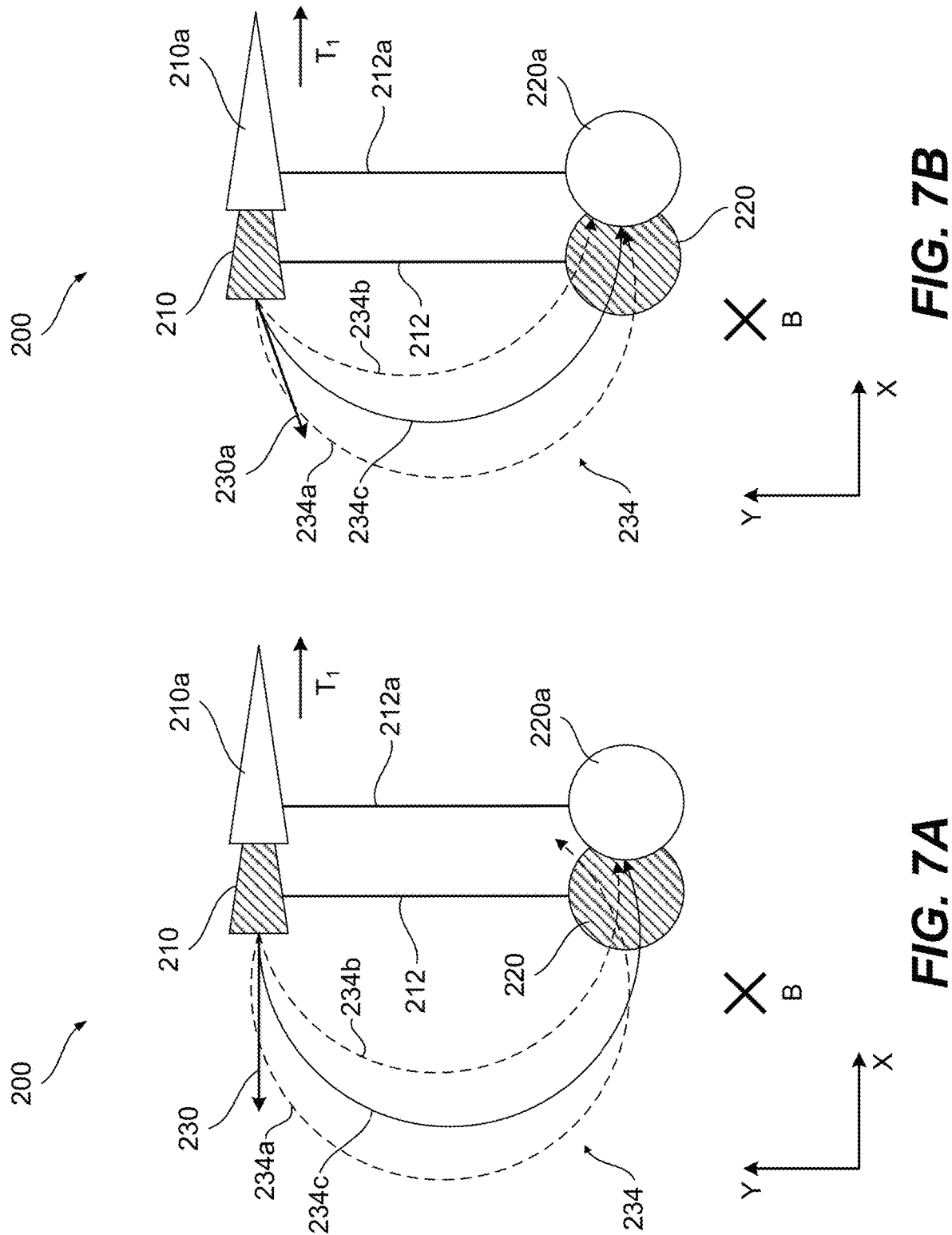

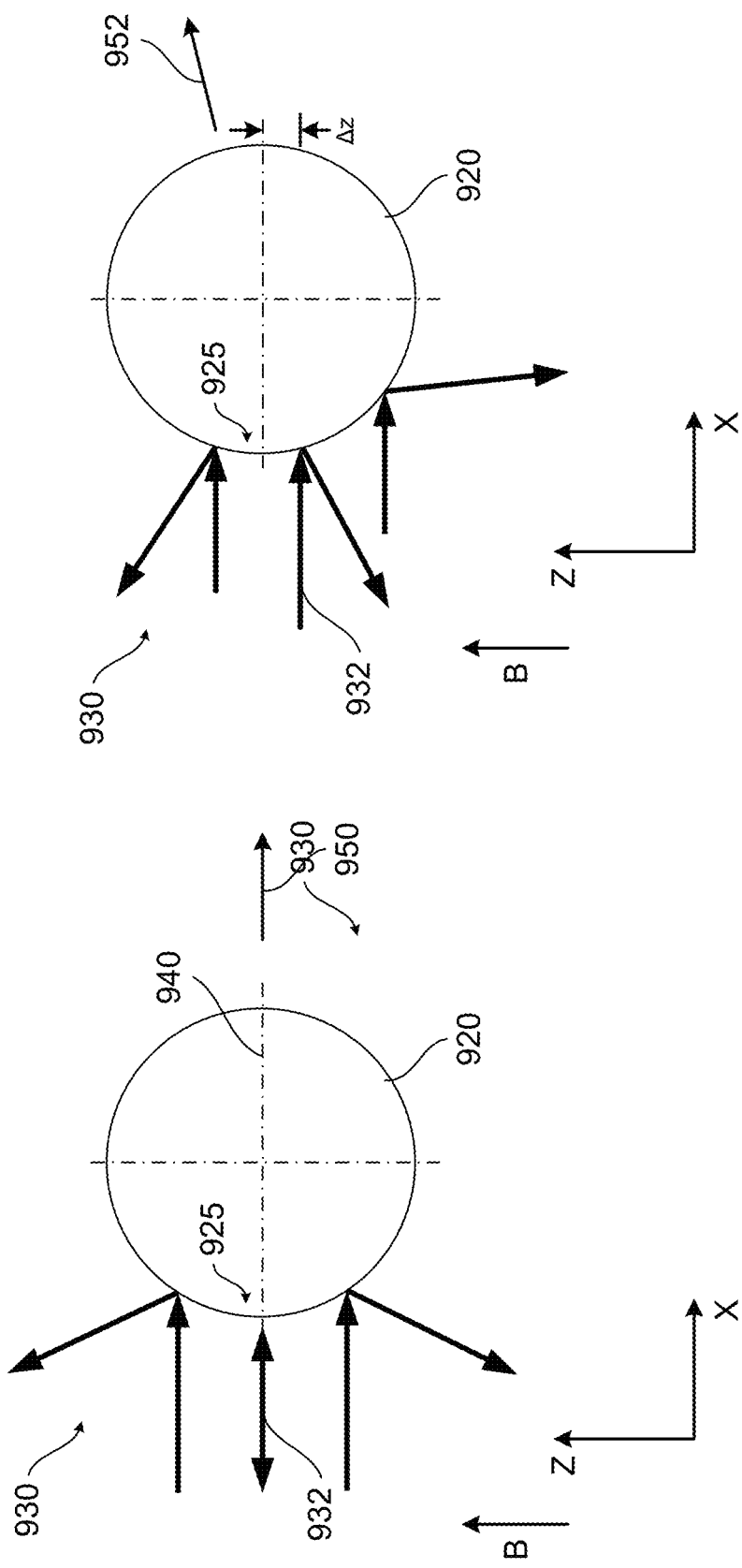

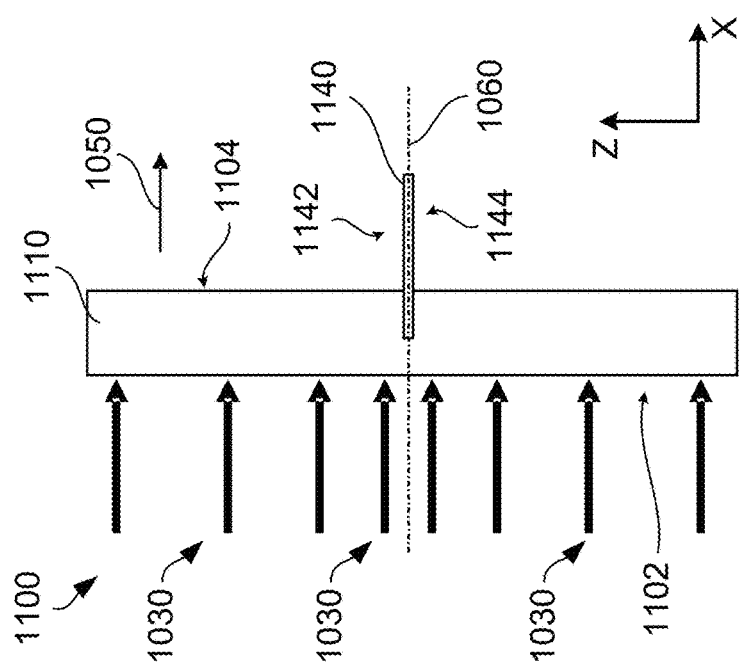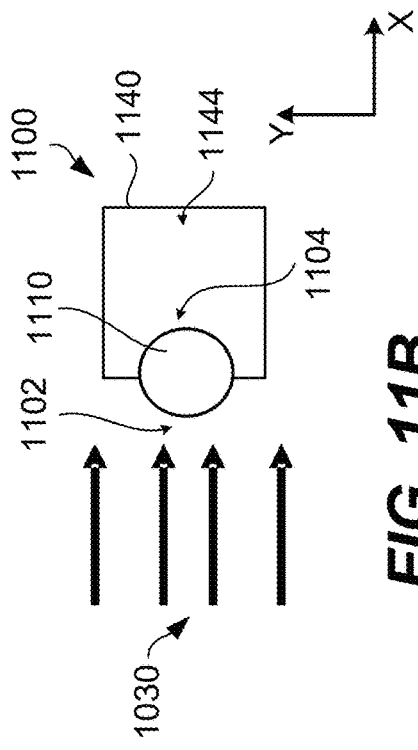
FIG. 11A
FIG. 11B

ENHANCED THRUST FROM ION-PROPELLED SPACECRAFT VIA TETHERED ION BLOCKER

TECHNICAL FIELD

The present disclosure relates generally to spacecraft propulsion, and in particular, to ion propulsion systems.

BACKGROUND

Performing orbit-raising maneuvers or station keeping in Low Earth Orbit (LEO) requires expelling propellant to produce impulse. The amount of impulse produced for each kilogram of propellant is called specific impulse (Isp). Low-speed propellants (e.g., from chemical rockets) have low specific impulse, requiring a large mass of propellant to be launched from Earth with associated high costs for launch. High-speed propellants (e.g., from ion engines) use ions as propellant. Their high specific impulse reduces the needed mass of propellant, but requires costly and heavy electric power systems.

Consequently, there exists a need for improved systems and methods for increasing impulse to a spacecraft performing maneuvers in LEO with lower mass and lower electric power.

SUMMARY

The following presents a simplified summary of the disclosure in order to provide a basic understanding of certain embodiments of this disclosure. This summary is not an extensive overview of the disclosure, and it does not identify key and critical elements of the present disclosure or delineate the scope of the present disclosure. Its sole purpose is to present some concepts disclosed herein in a simplified form as a prelude to the more detailed description that is presented later.

Provided are various spacecraft propulsion systems, and associated methods of operation. Specifically, a spacecraft comprises an ion propulsion system and one or more electrically insulated tethers. Each of the one or more electrically insulated tethers is coupled to the spacecraft at a first end of each of the one or more electrically insulated tethers. The spacecraft further comprises an ion blocker coupled to a second end of each of the one or more electrically insulated tethers.

The ion propulsion system may be configured to generate a first propulsive force by emitting a charged ion beam in a direction with an ion velocity vector comprising an ion vector component that is perpendicular to a magnetic field of a planet. The magnetic field may cause the ion beam to curve toward the ion blocker at a trajectory such that ions within the ion stream are blocked by the ion blocker to generate a second propulsive force on the ion blocker.

The ion blocker may block ions within the ion stream by contacting the ions or deflecting the ions to generate the second propulsive force on the ion blocker. The ion blocker may comprise an elongated structure with a horizontal width that is greater than a vertical height. The ion blocker may comprise an aspect ratio of approximately 8:1. For example, the ion blocker may comprise an elongated cylindrical structure. As another example, the ion blocker may comprise a spherical or ellipsoidal structure.

The ion blocker may comprise an expandable balloon. The ion blocker may comprise a flat sheet of a material stabilized by a plurality of support structures. The flat sheet of material may comprise an open grid structure. The ion blocker may comprise a flat contact surface facing a rear side of the ion blocker, wherein the flat contact surface is configured to contact or deflect ions in the ion stream.

The ion blocker may be positioned at about twice a gyroradius of the trajectory of the ion stream. The surface of the ion blocker may be configured to accumulate an electrical charge from ions contacting the ion blocker such that at least a portion of subsequent ions are deflected before contacting the surface of the ion blocker. The ion blocker may comprise a conductive or metallized surface.

The ion blocker may be deployed from the spacecraft in orbit of the planet. A gravitational force of the planet may produce a restoring force on the ion blocker that stabilizes the ion blocker from propulsive forces caused by ions contacting the ion blocker or deflected by the ion blocker.

The one or more tethers may be adjustable in length. A length of each of the one or more tethers may be adjusted based on a computed gyroradius of the trajectory of the ion stream. The gyroradius of the trajectory of the ion stream may be computed based on a direction of the magnetic field and a strength of the magnetic field. The one or more tethers may be adjusted by a reel mechanism.

The one or more tethers may comprise a Hoyt tethers. The one or more tethers may comprise an optical fiber configured to transfer power or data from the ion blocker to the spacecraft.

The ion propulsion system may emit at least one of argon ions, lithium ions, and neon ions. The ion stream may spread into a plume that is substantially wider in a first direction parallel to the magnetic field than a second direction perpendicular to the magnetic field. The ion stream may be angled downward relative to a longitudinal axis of the spacecraft to compensate for a forward motion of the spacecraft. The ion propulsion system may be configured to emit electrons along an electron velocity vector that minimizes mixing of emitted electrons with emitted ions. The ion stream may comprise a non-circular beam spread that includes a vertical spread that is greater than a horizontal spread.

The ion propulsion system may comprise a thruster configured to be laterally gimbaled to increase a velocity vector of the spacecraft that is greater than or less than 90 degrees with respect to the magnetic field. The ion propulsion system may be configured to emit two ion streams that diverge laterally, wherein a peak flux of each ion stream contacts respective lateral sides of the ion blocker to produce respective lateral forces that urge the ion blocker to a center position. The ion blocker may further comprise a vertical stabilizer extending toward a front side of the ion blocker.

Other implementations of this disclosure include corresponding devices and systems, as well as and associated methods for dynamically predicting delivery service values. These other implementations may each optionally include one or more of the following features. For instance, provided is a propulsion system comprising an ion blocker and one or more tethers. The one or more tethers are electrically insulated. A first end of each of the one or more tethers is coupled to a spacecraft, and a second end of each of the one or more tethers is coupled to the ion blocker. The propulsion system further comprises an ion thruster configured to generate a first propulsive force by emitting a charged ion beam in a direction with an ion velocity vector comprising an ion vector component that is perpendicular to a magnetic field of a planet. The magnetic field causes the ion stream to curve toward the ion blocker at a trajectory such that ions within the ion stream are blocked by the ion blocker to generate a second propulsive force on the ion blocker.

Also described is a method comprising emitting a charged ion stream from an ion propulsion system of a spacecraft. The ion beam is emitted in a direction with an ion velocity vector comprising an ion vector component that is perpendicular to a magnetic field of a planet, wherein the emitted ion beam generates a first propulsive force, wherein a trajectory of the ion beam is curved via the magnetic field. The method further comprises blocking the ion stream with an ion blocker to generate a second propulsive force on the ion blocker, wherein the ion blocker is suspended from the spacecraft via one or more electrically insulated tethers.

The ion blocker may block ions within the ion stream by contacting the ions or deflecting the ions to generate a second propulsive force on the ion blocker. The method may further comprise determining a gyroradius of the trajectory of the ion stream based on a direction of the magnetic field and a strength of the magnetic field, and positioning the ion blocker based on the determined gyroradius. A center of the ion blocker is positioned at approximately twice the determined gyroradius of the trajectory. The ion blocker may be positioned by adjusting a length of each tether by a reel mechanism.

The direction of the magnetic field and the strength of the magnetic field may be determined by measuring the magnetic field, or determining the direction of the magnetic field and the strength of the magnetic field based on an altitude and a location of the spacecraft relative to the planet, or receiving data on the magnetic field.

The method may further comprise deploying the ion blocker from the spacecraft in orbit of the planet. The method may further comprise positioning the ion blocker at about twice a gyroradius of the trajectory of the ion stream.

The method may further comprise directing the ion stream downward relative to a longitudinal axis of the spacecraft to compensate for a forward motion of the spacecraft. The method may further comprise emitting electrons along an electron velocity vector that minimizes mixing of emitted electrons with emitted ions.

The method may further comprise laterally adjusting a thruster of the ion propulsion system to increase a velocity vector of the spacecraft that is greater than or less than 90 degrees with respect to the magnetic field. The method may further comprise emitting two ion streams that diverge laterally, wherein a peak flux of each ion stream contacts respective lateral sides of the ion blocker to produce respective lateral forces that urge the ion blocker to a center position.

These and other embodiments are described further below with reference to the figures.

BRIEF DESCRIPTION OF THE DRAWINGS

The disclosure may best be understood by reference to the following description taken in conjunction with the accompanying drawings, which illustrate particular embodiments of the present disclosure.

FIG. 2 is a schematic illustration of an ion propelled spacecraft with a tethered ion blocker, in accordance with one or more embodiments;

FIGS. 4C and 4D illustrate an example ion plume produced by an ion thruster, in accordance with one or more embodiments;

FIGS. 7A and 7B illustrate schematic views of convergence locations of different trajectories of ion exhaust emitted by an ion thruster, in accordance with one or more embodiments;

FIGS. 9A, 9B, 9C, and 9D illustrate schematic views of the lateral position of a tethered ion blocker, in accordance with one or more embodiments;

FIGS. 11A, 11B, and 11C illustrate an ion blocker with a vertical stabilizer, in accordance with one or more embodiments;

DETAILED DESCRIPTION OF PARTICULAR EMBODIMENTS

Figure 1:
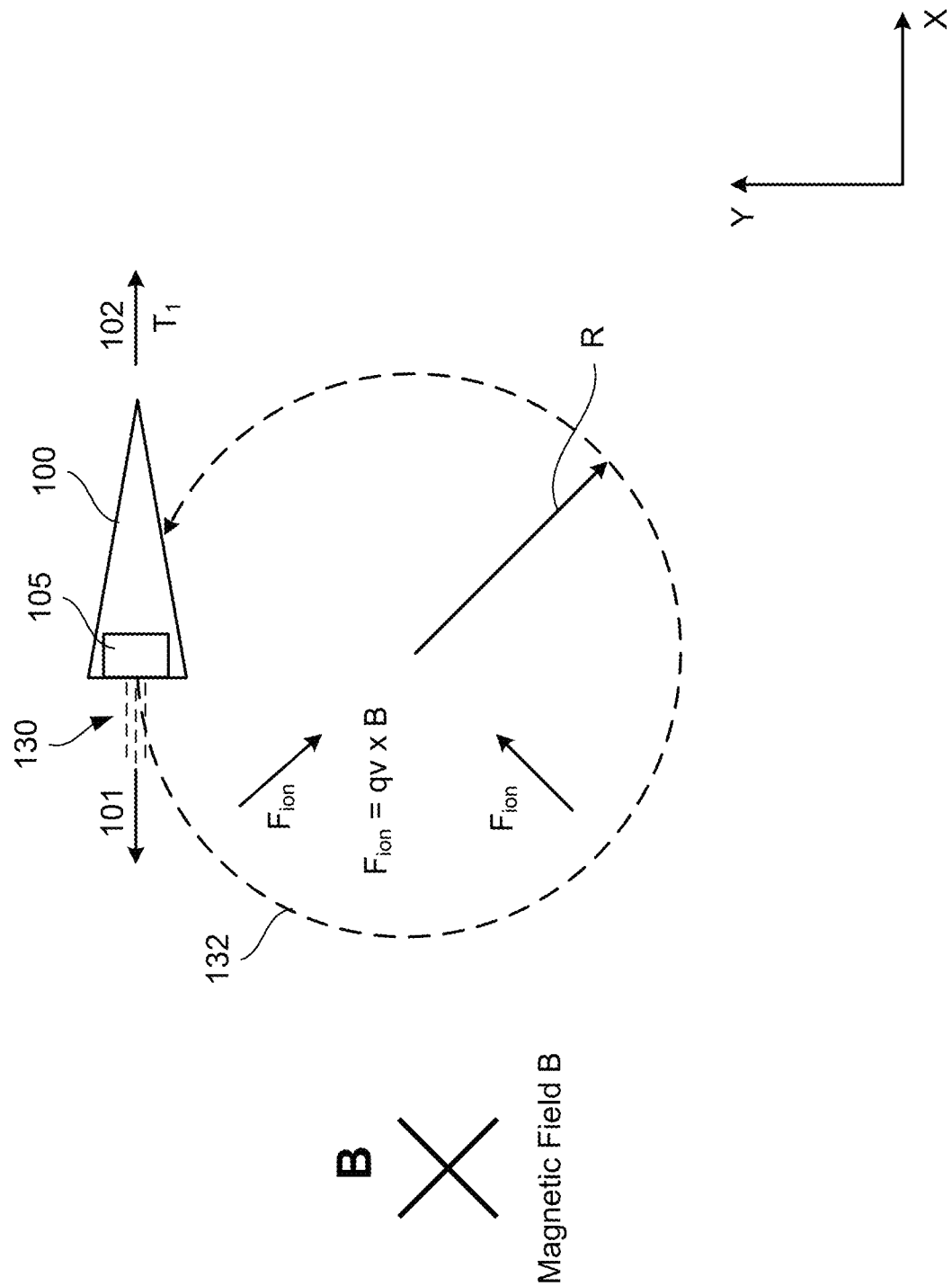
FIG. 1 is a schematic illustration of an ion propelled spacecraft, in accordance with one or more embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific examples, it will be understood that these examples are not intended to be limiting. On the contrary, it is intended to cover alternatives, modifications, and equivalents as may be included within the spirit and scope of the present disclosure as defined by the appended claims.

For example, the techniques of the present disclosure will be described in the context of particular spacecraft, such as satellites, operating in Low Earth Orbit (LEO). However, it should be noted that the techniques and mechanisms of the present disclosure may apply to various other vehicles, aircraft, and propulsion systems to be operated in space. In the following description, numerous specific details are set forth in order to provide a thorough understanding of the present disclosure. Particular example embodiments of the present disclosure may be implemented without some or all of these specific details. In other instances, well known process operations have not been described in detail in order not to unnecessarily obscure the present disclosure. Various techniques and mechanisms of the present disclosure will sometimes be described in singular form for clarity. However, it should be noted that some embodiments include multiple iterations of a technique or multiple instantiations of a mechanism unless noted otherwise.

Overview

The present disclosure describes novel improved propulsion systems for spacecraft which implement a tethered structure extending from the spacecraft to capture additional momentum from ions emitted by an ion propulsion system, thereby increasing efficiency of the fuel load.

Existing propulsion systems for spacecraft expel propellant to produce impulse in order to navigate in space, such as orbit-raising maneuvers or station keeping in Low Earth Orbit (LEO). However, chemically propelled spacecraft have low specific impulse (Isp) values and, as a result, require large fuel loads, which increase the costs of such propulsion solutions. Additionally, such reactive and energetic chemicals utilized in such chemical propulsion systems are dangerous and toxic. Ion propulsion systems use ions as propellant, which have a high Isp, reducing the mass of propellant. However, ion propulsion systems have high power requirements, and implement costly and fairly heavy electric power systems. Additionally, ion-self impingement may reduce overall thrust and can cause physical damage to the spacecraft in LEO.

In various embodiments, a space tether is a long cable used to couple spacecraft to each other or to other masses, such as a spent booster rocket, space station, or an asteroid. Space tethers are usually made of thin strands of high-strength fibers or conducting wires. The tether can provide a mechanical connection between two space objects that enables the transfer of energy and momentum from one object to the other, and as a result they can be used to provide means for space propulsion. Additionally, conductive space tethers have been implemented to interact with the Earth's magnetic field and ionospheric plasma to generate thrust or drag forces without expending propellant.

Several space missions have successfully deployed and used tethers. These include many yo-yo despin tether deployments like the Dawn interplanetary mission, the National Aeronautics and Space Administration's (NASA) Students for the Exploration and Development of Space (SEDS) series (SEDS I, SEDS II, and Plasma Motor Generator (PMG)) which demonstrated active control of tether oscillations, and the US Naval Research Laboratory's Tether Physics and Survivability Experiment (TiPS) which deployed a 4,000 meter tether that survived intact for ten years. This is about an order of magnitude longer than a typical tether used in the described embodiments.

The ion propulsion systems and spacecraft described herein increase impulse with lower mass than chemical propulsion systems and with lower electric power than existing ion engines, while minimizing ion self-impingement. The described embodiments utilize a tethered ion blocker to block emitted ions traveling in a trajectory that is curved by the magnetic field of a planet. The blocked ions transfer momentum to the ion blocker, and to the spacecraft, in addition to the initial thrust generated by the ion engine.

Thus, compared to standard ion propulsion systems, the ion propulsion systems and spacecraft described herein use less power and energy to achieve the same thrust and impulse, prevent performance losses from ion self-impingement, and prevent damage from ion self-impingement. The described systems further allow mission operations to be performed with less mass by providing higher specific impulse. For example, the specific impulse (Isp) of standard ion propulsion systems is:

$$Isp = \frac{v_{ex}}{g}$$

where $v_{ex}$ is the exhaust velocity of the ions from the ion thruster, and g is the acceleration of gravity at the planet's surface, such as that of Earth. However, the specific impulse provided by the described systems is modeled as:

$$Isp = \frac{v_{ex} + kv_{ex}}{g}$$

where k is a dimensionless coefficient in the range of 0<k<2.

When k=1, all ions emitted by the ion thruster impact the ion blocker and attach to the surface of the ion blocker. Thus, at k=1 the specific impulse for the spacecraft is doubled. When k=2, all emitted ions strike the ion blocker and are deflected in the opposite direction. Thus, at its most efficient, the described propulsions systems may triple the specific impulse with the same amount of propellant. The higher specific impulse results in a lower fuel load and lower operational cost. Such propulsion system further avoids the need for reactive, dangerous chemicals.

The ion blocker may be deployed from the spacecraft upon reaching the desired orbital position, such as LEO. The ion blocker may be suspended from the spacecraft by one or more electrically insulated tethers and positioned via a reel system. For example, the center of the ion blocker may be positioned at twice the determined gyroradius of the curved ion beam.

The ion blocker may be an inflatable balloon structure or a single sheet or sail supported by various support structures. Once deployed, the ion blocker comprises a contact surface with a large cross-sectional area to receive approaching ions. In some embodiments, the cross-sectional area comprises a much larger width than height to increase the amount of ions that are captured due to a greater lateral divergence of emitted ions. For example, the ion blocker may include a cross-sectional surface area with an aspect ratio of approximately 8:1. However, the geometry of the ion blocker may be appropriately configured based on the ion beam emitted by the ion thruster, which may be modified to limit divergence of ions in various directions.

In some embodiments, the ion blocker may be configured to maintain its lateral position with respect to the spacecraft. For example, the contact surface of the ion blocker may include a swept or concave shape. Vertical stabilizers may also be implemented to improve lateral stability. Adjustments to the tether lengths and/or direction of ion exhaust may also be implemented to manage vertical stability of the ion blocker and maximize capture of ions.

In some embodiments, the surface of the ion blocker is made conductive to build electric potential. A fully charged surface may deflect approaching ions to further increase thrust generated at the ion blocker. Such propulsion systems may nearly double the impulse for a given amount of propellant with the same exhaust speed.

Example Embodiments

To better understand various aspects of fuselage barrel panels, a brief description of an ion propelled spacecraft is now presented. FIG. 1 is a schematic illustration of an ion propelled spacecraft 100, in accordance with some embodiments. As depicted in FIG. 1, spacecraft 100 comprises ion propulsion system 105 which emits ion beam 130 via an ion thruster or ion engine. As used herein, the term ion beam may be used interchangeably with the terms "ion stream" or "ion exhaust." A spacecraft with ion propulsion system 105, such as spacecraft 100, typically includes a large electric power system. The spacecraft ejects ions in one direction (arrow 101 along the X-axis) to produce thrust in the opposite direction (arrow 102 along the X-axis). The ion propulsion system is also typically configured to eject electrons so that the spacecraft remains neutral. The magnetic field B may be produced by a planetary body, such as Earth or Jupiter, or other object in space. The magnetic field B is shown to include a vector force directed into the page (Z-axis).

During operation, the ions in ion beam 130 may be emitted in a direction that is perpendicular to the magnetic field B. Relative to the spacecraft, each ion in the ion exhaust includes momentum $m_{ion}v_{ex}$ where $m_{ion}$ is the mass of the ion and $v_{ex}$ is the exhaust velocity. Collectively, the ions deliver thrust $T_1 = \mu_1 v_{ex}$ where $\mu_1$ is the mass flow rate of ions leaving the spacecraft.

When ions travel at $v_{ex}$ in a direction that is perpendicular to the magnetic field, the force from the magnetic field acts on the emitted ions to curve the trajectory 132 of each emitted ion into the circular path shown in FIG. 1. The magnetic force on each ion is $F_{ion} = qv \times B$ where q is the ion's charge, v is the ion's velocity, x indicates a cross product, and B is the magnetic field. The total force $F_{beam}$ on the ion beam along trajectory 132 is $F_{beam} = -2\mu_1 v_{ex}$. By conservation of momentum, the planet's magnetic field transfers momentum $2m_{ion}v_{ex}$ from each ion to the planet as the ion reverses direction. Collectively, this transfers momentum from the emitted ions to the planet at a rate of $2\mu_1 v_{ex}$.

The radius of the trajectory of an emitted ion in the magnetic field is referred to as gyroradius or gyradius (R). Its value is given by:

$$R = \frac{m_{ion}v_{rel}}{qB}$$

where $m_{ion}$ is the mass of the ion, $v_{rel}$ is the speed of the ion relative to the source of the magnetic field, q is the ion charge, and B is the magnetic field intensity. For example, with singly-ionized argon (mass=$6.65 \times 10^{-26}$ kg, q=$1.6 \times 10^{-19}$ Coulombs), ejection velocity of 19,620 m/sec (specific impulse Isp=2000 sec), and magnetic field intensity 0.35 gauss (typical for low Earth orbit), the gyroradius R is approximately 233 meters.

Ion self-impingement may occur to a spacecraft that is ejecting an ion beam in a magnetic field. If left unaffected, the ions that are emitted perpendicular to the magnetic field will make one loop in the field and strike the spacecraft on the side opposite of the thruster. This causes a loss in thrust caused by the momentum of the curved ion, which cancels part of the nominal thrust when striking the front of the spacecraft. The looped ions also cause heating of the spacecraft. A typical ion thruster puts several kilowatts of kinetic power in the ion beam. Whatever fraction of that energy strikes the spacecraft and turns into heat, which requires more radiator area, and increased mass as a consequence. Ions striking the front of the spacecraft at high speeds may further cause erosion of material from the spacecraft's coatings. Such material may collect on optics equipment or other sensitive surfaces, which may compromise functionality and mission performance.

Low Earth orbit (LEO) is in the F2 layer of the ionosphere. On average, ions in the F2 layer persist overnight (i.e., for several hours). Therefore, ions emitted by the ion thruster will survive the fraction of a second needed to make a complete loop, rather than be neutralized by an electron in the ionosphere. Many types of existing electric spacecraft propulsion systems utilize methods to neutralize the ion beam as soon as it leaves the spacecraft. Typically, such systems emit low-energy electrons next to the ion beam.

Spacecraft and ion thruster systems, as described herein, utilize the curved trajectory ions to increase the impulse to a spacecraft performing orbit-raising or station-keeping maneuvers in LEO, while minimizing ion self-impingement. In various embodiments, an ion blocker may be implemented to block the curved ions. The ion blocker may be attached to the spacecraft with a tether and deployed to a distance where it is struck by ions emitted by an ion engine of an ion thruster system gyrating in Earth's magnetic field. Impact of the ions on the ion blocker transfers momentum from the ions to the ion blocker to produce thrust in addition to the primary thrust generated by the ion engine.

In various embodiments, a tethered ion blocker is implemented with an ion propulsion system to block the curved ions to increase forward thrust. As used herein, blocking of ions by the ion blocker refers to the interaction between the ion blocker and ions which deliver momentum to the ion blocker by deflecting, impacting, striking, or other interaction with the ion blocker that would be understood by one of ordinary skill in the art. A simple model of an example ion propelled spacecraft 200 with a tethered ion blocker is described with reference to FIG. 2. In various embodiments, spacecraft 200 comprises ion blocker 220 coupled to a body 210 of the spacecraft by tether 212.

In various embodiments, spacecraft 200 is configured to orbit a planet 290 with a magnetic field, such as in LEO around Earth. As explained in FIG. 1, spacecraft 200 may comprise ion propulsion system 205 which emits ion beam 230 of positively charged ions via an ion thruster in a direction (arrow 201 along the X-axis) that is perpendicular to a magnetic field B with a vector force directed into the page (Z-axis). The emitted ions produce thrust $T_1$ in the opposite direction (arrow 202 along the X-axis).

As previously described, existing types of electric spacecraft propulsion neutralize the ion beam as soon as it leaves the spacecraft, typically by emitting low-energy electrons next to the ion beam. However, the described embodiments keep electrons and emitted ions on separate paths. In some embodiments, electrons are ejected with substantial velocity, in a direction that is perpendicular, or substantially perpendicular, to ion beam 230 and roughly parallel to the magnetic field lines of B. For example, an electron gun like such as those used in cathode ray tubes may be used to eject electrons.

It is feasible to eject electrons from near an ion beam with a large positive charge provided the ejection point is at least a few meters away from the ion thruster of the spacecraft. The beam of ions attracts, and is largely shielded by, a cloud of ionospheric electrons. The density of this cloud is low enough to not seriously increase the ion-electron recombination rate. The ejected beam of electrons attracts, and is largely shielded by, a cloud of ionospheric ions. The result is that electrons of moderate energy can escape from the spacecraft and the ion beam. Because the ions in ion beam 230 are not neutralized, the force from the magnetic field curves each ion along trajectory 232.

In various embodiments, tether 212 is a flexible tensile element connecting spacecraft 200 to ion blocker 220. In some embodiments, tether 212 may represent multiple tethers. Prior space tether missions have implemented tethers which were conductive to allow the flow of charge in one or more directions. However, in some embodiments, tether 212 is configured to be electrically insulating to prevent or significantly reduce electron flow from one end of the tether to the opposite end. In some embodiments, spacecraft 200 comprises multiple tethers coupling the ion blocker to the spacecraft.

In some embodiments, the one or more tethers of the tether system are deployed from the spacecraft from orbit by a deployment mechanism, such as a reel system. In some embodiments, the tether is deployed to extend to approximately two times the gyroradius of trajectory 232 of ion beam 230.

In various embodiments, ion blocker 220 is a structure with a surface facing the rear of the spacecraft. In some embodiments, this surface includes a large cross-sectional area for blocking the curved ion beam. The ion blocker may comprise various configurations described herein. For example, the ion blocker may be a balloon that is inflated in orbit after deployment from the spacecraft. As another example, the ion blocker may be a single sheet or sail structure. Other ion blocker embodiments will be further described below.

In the simple model depicted in FIG. 2, the ion thruster outputs a collimated beam 230 of ions perpendicular to magnetic field B with uniform speed, $v_{ex}$. In this ideal system, thrust generated by the thruster is $\mu_1 v_{ex}$, where $\mu_1$ is the mass flow rate of ion beam 230. Thus, the thrust $T_1$ experienced by the spacecraft is $-\mu_1 v_{ex}$.

The magnetic field B causes the ions to curve along trajectory 232. In the simple model, after traveling the semicircular path, each ion impacts ion blocker 220 and sticks to it or comes off of it with zero speed. Thrust ($T_2$) at the blocker is defined by $T_2=\mu_2 v_2=k\mu_1 v_{ex}$, where $\mu_2$ is the mass flow rate of ions that impact the ion blocker, and $v_2$ is the velocity of the impacting ions. In the simple model, the ions travel along the trajectory at uniform velocity such that $v_2=v_1$. Furthermore, the mass flow rate $\mu_2$ of ions striking the ion blocker is equal to the mass flow rate $\mu_1$ such that $\mu_2=\mu_1$. In the simple model, each ion that leaves the thruster impacts the blocker, so that k=1, such that $T_2=T_1$. Thus, all available momentum from the curved ion beam is captured at the blocker.

This transfers each impacting ion's momentum $-m_{ion}v_{ex}$ to the ion blocker. Collectively, the ions transfer momentum to the ion blocker at a rate of $T_2=-m\_dot_2 v_{ex}$. This increases thrust for the spacecraft (including the tether and ion blocker) beyond the $=-m\_dot\ v_{ex}$ produced by ion beam 230. Thus, the total thrust for the system is $T_1+T_2=-2\ m\_dot\ v_{ex}$.

The extra impulse for the spacecraft is balanced by momentum transferred to the planet 290. The planet's magnetic field exerts force on the ions to move them in a curved path. Under Newton's third law (requiring this action to have an equal, opposite reaction), when the magnetic field exerts force to curve each ion's path, the magnetic field exerts an equal, opposite force on the planet. The spacecraft's additional acceleration due to the impacting ions is balanced by a tiny acceleration of the planet in the opposite direction.

In some embodiments, electrically insulated tethers are implemented to achieve the additional propulsive thrust. Positive ions that impact the ion blocker may transfer charge to the ion blocker. An electrically conductive tether would allow the charge to flow up the tether as electric current and return to the spacecraft. For example, the magnetic field would exert force $F_{tether}=I \cdot L \times B$ on the current, where I is the current passing through the tether and L is the length of the tether. This force $F_{tether}$ would cancel the impulse imparted to the ion blocker by the impacting ions. Thus, the tether must be electrically insulated to prevent the flow of current up the tether.

In some embodiments, the tethers may are configured to withstand wear and impact during operation. For example, the tethers may be constructed in a yarn or woven structure. As another example, the tethers may comprise Hoytethers composed of multiple lines with redundant interlinking that is able to withstand many impacts and cuts by micrometeoroids or debris. In various embodiments, the tethers are thick enough to survive predicted erosion by the ion beam, including the reduced fluence due to ions that do not touch the tether surface when it is charged.

In some embodiments, a tether includes optical fiber to carry power or data to or from the ion blocker. Optical fiber is an electrical insulator which would prevent the flow of charge between the ion blocker and spacecraft. In some embodiments, wires including high-voltage protection circuits are implemented along the one or more tethers to carry power and/or data to and from the ion blocker. The tethers may also be configured to carry acoustic vibrations to and from the ion blocker, such as stress, shear, or circular vibrations to carry power and/or data to and from the ion blocker. For example, such mechanisms may be used to receive information from sensors located on the ion blocker for measuring temperature, magnetic field strength, atmosphere density, etc.

Figure 3:
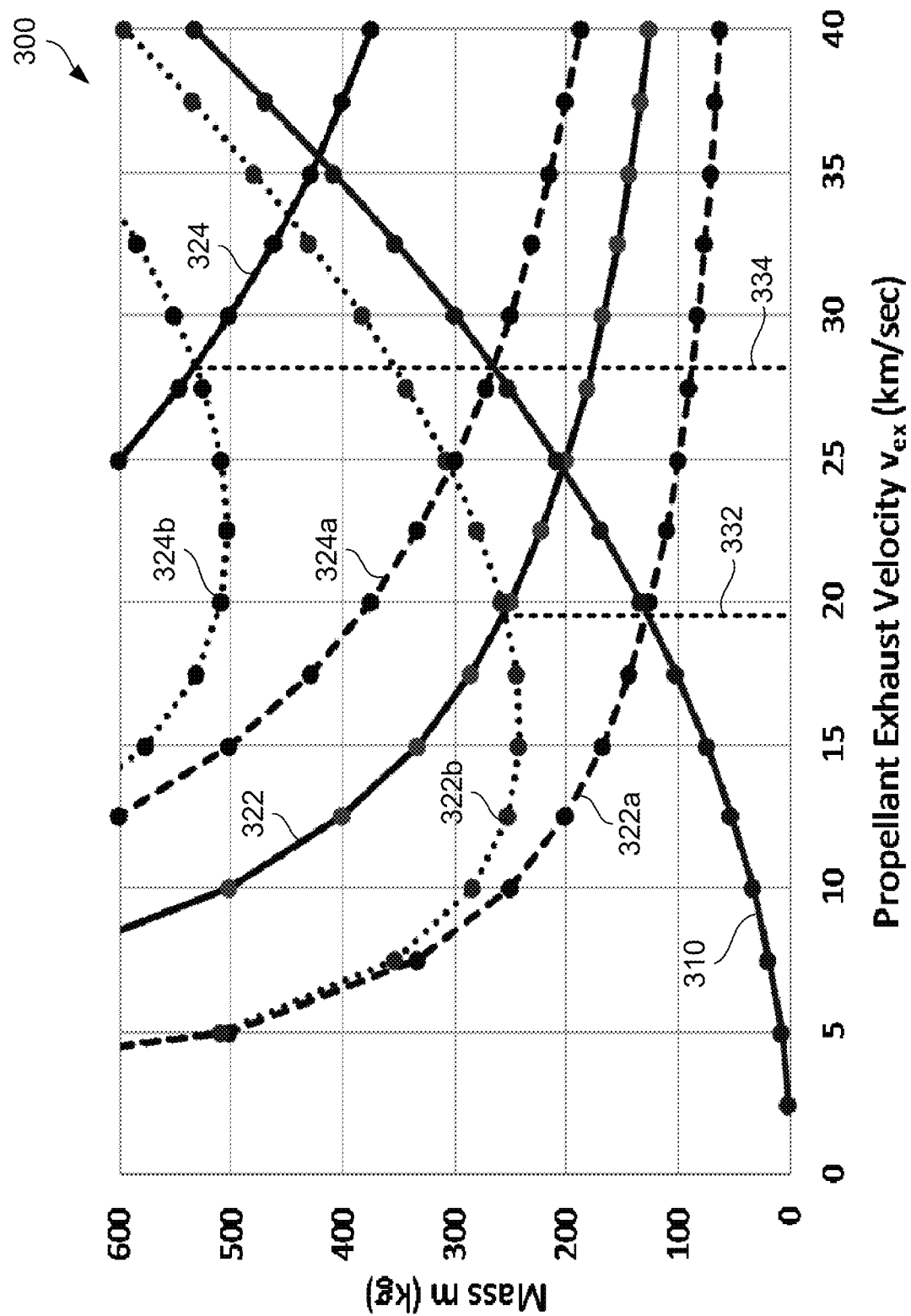
FIG. 3 is a graph of system performance of an example propulsion system of an illustrative embodiment.

FIG. 3 is a graph 300 of system performance of an example propulsion system of an illustrative embodiment. Graph 300 models an embodiment comprising a cylindrical ion blocker with argon ion thruster in LEO. Mass per unit area is estimated for the ion blocker by scaling from the Stratos 2 high-altitude balloon which comprised an area of approximately 38,000 m² and mass of approximately 1690 kg. A cylindrical ion blocker may be a conveniently inflatable shape.

The example cylindrical ion blocker may be approximately 120 meters long and 15 meters high, which provides a reasonable contact surface assuming emission of argon propellant at exhaust velocity of approximately 30 km/sec (Isp of 3000 sec for a simple thruster). The cylindrical ion blocker would have an area of approximately 6,005 m² and mass of approximately 270 kg. The total mass of the ion blocker may be approximately 300 kg including the tether, reel, and deployment mechanism. The curve 310 represents the mass of the ion blocker, which is proportional to $v_{ex}^2$ (the square of the ion beam exhaust velocity). As such, a higher exhaust velocity would cause a larger gyroradius and more beam spread before reaching the blocker, which requires a larger (and heavier) ion blocker. As shown, curve 310 passes through 300 kg at $v_{ex}$=30 km/sec.

Curves 322, 322a, 324, and 324a indicate the propellant used for an ion-propelled spacecraft. Each of curves 322, 322a, 324, and 324a represents the amount of propellant needed to deliver a particular total impulse. By calculating the change in momentum required to move a spacecraft of a specific mass at a specific velocity, it is possible to calculate the mass of propellant and the required exit velocity of that propellant from the spacecraft. Curves 322 and 322a show the required propellant mass and propellant exit velocity from a 5000 kg spacecraft at a velocity of 1 km/s. Curves 324 and 324a show the required propellant mass and propellant exit velocity from a 5000 kg spacecraft at a velocity of 3 km/s.

Curves 322 and 324 show the required propellant mass and propellant exit velocity, at the respective velocities, by the 5000 kg spacecraft with an existing ion propulsion system not including a tethered ion blocker. Table 1 and table 2 list the required propellant mass and propellant exit velocity for curves 322 and 324, respectively:

TABLE 1

For a 5000 kg spacecraft with 1 km/sec velocity (Curve 322)

| Exit velocity of propellant $v_{ex}$ (km/s) | Mass of propellant required (kg) |
|---|---|
| 10 | 500 |
| 20 | 250 |
| 30 | 167 |
| 40 | 125 |
| 50 | 100 |

TABLE 2

For a 5000 kg spacecraft with 3 km/sec velocity (Curve 324)

| Exit velocity of propellant $v_{ex}$ (km/s) | Mass of propellant required (kg) |
|---|---|
| 10 | 1500 |
| 20 | 750 |
| 30 | 500 |
| 40 | 375 |
| 50 | 300 |

Curves 322a and 324a (in dashed lines) show the required propellant mass and propellant exit velocity, at the respective velocities, by the 5000 kg spacecraft with the described propulsion systems including the tethered ion blocker. Curves 322a and 324a which assumes that all emitted ions impact and stick to the ion blocker (such that coefficient k=1), thereby doubling the specific impulse provided per weight of propellant at a given exhaust velocity. Table 3 and table 4 list the required propellant mass and propellant exit velocity for curves 322a and 324a, respectively:

TABLE 3

For a 5000 kg spacecraft with 1 km/sec velocity (Curve 322a)

| Exit velocity of propellant $v_{ex}$ (km/s) | Mass of propellant required (kg) |
|---|---|
| 10 | 250 |
| 20 | 125 |

TABLE 3-continued

For a 5000 kg spacecraft with 1 km/sec velocity (Curve 322a)

| Exit velocity of propellant $v_{ex}$ (km/s) | Mass of propellant required (kg) |
|---|---|
| 30 | 84 |
| 40 | 63 |
| 50 | 50 |

TABLE 4

For a 5000 kg spacecraft with 3 km/sec velocity (Curve 324a)

| Exit velocity of propellant $v_{ex}$ (km/s) | Mass of propellant required (kg) |
|---|---|
| 10 | 750 |
| 20 | 375 |
| 30 | 250 |
| 40 | 188 |
| 50 | 150 |

Curves 322b and 324b show the combined mass of a blocker (curve 310) plus the required propellant when a blocker is present (curves 322a and 324a) where k=1. That is, curves 322b and 324b indicate the propulsion system mass using the described ion propulsion system. Regions where line 322b is less than line 322, or where line 324b is less than 324, indicate conditions where the described propulsion system uses mass more efficiently than a conventional ion propulsion system with a standalone ion thruster. For example, at just under 20 km/sec exhaust velocity, combined mass curve 322b intersects curve 322 for a 5000 kg spacecraft with 1 km/sec Δv. Thus, the region to the left of that point (i.e., to the left of dashed line 332), where exhaust velocity is lower than just under 20 km/sec (about 2000 sec Isp), the described propulsion system uses propellant more efficiently compared to a spacecraft using conventional ion propulsion, even with the approximately 130 kg of additional mass from the tethered ion blocker.

Another crossover point between combined mass curve 324b and curve 324) is shown at about 28 km/sec exhaust velocity (dashed line 334) for a 5000 kg spacecraft with 3 km/s Δv. Thus, the region to the left of this point (i.e., to the left of dashed line 334), where exhaust velocity is lower than approximately 28 km/s, the described propulsion system uses propellant more efficiently compared to a spacecraft using conventional ion propulsion, even with the additional mass from the tethered ion blocker. This may be considered a reasonable amount of impulse for a large spacecraft that must maintain a low orbit for several years. The Δv values described here refer to plane-change impulse. The values may vary for impulse that is parallel to spacecraft velocity.

Graph 300 illustrates a benefit of the described systems in terms of mass compared to standard ion propulsion systems. However, another option may include launching a package with the same total mass, but lower exhaust velocity. This may allow a smaller power system, which typically reduces the expenses for launch and operation.

Ion Beam Divergence

During operation, emitted ions may diverge as they exit the ion thruster. For example, with a Xenon Ion Propulsion System (XIPS) thruster, approximately 1% of ions are more than 25° from the beam center. To capture a useful fraction of the momentum in the curved ion beam, an ion blocker must comprise a large enough surface area to block or deflect a majority of ions despite the divergence.

Figure 4B:
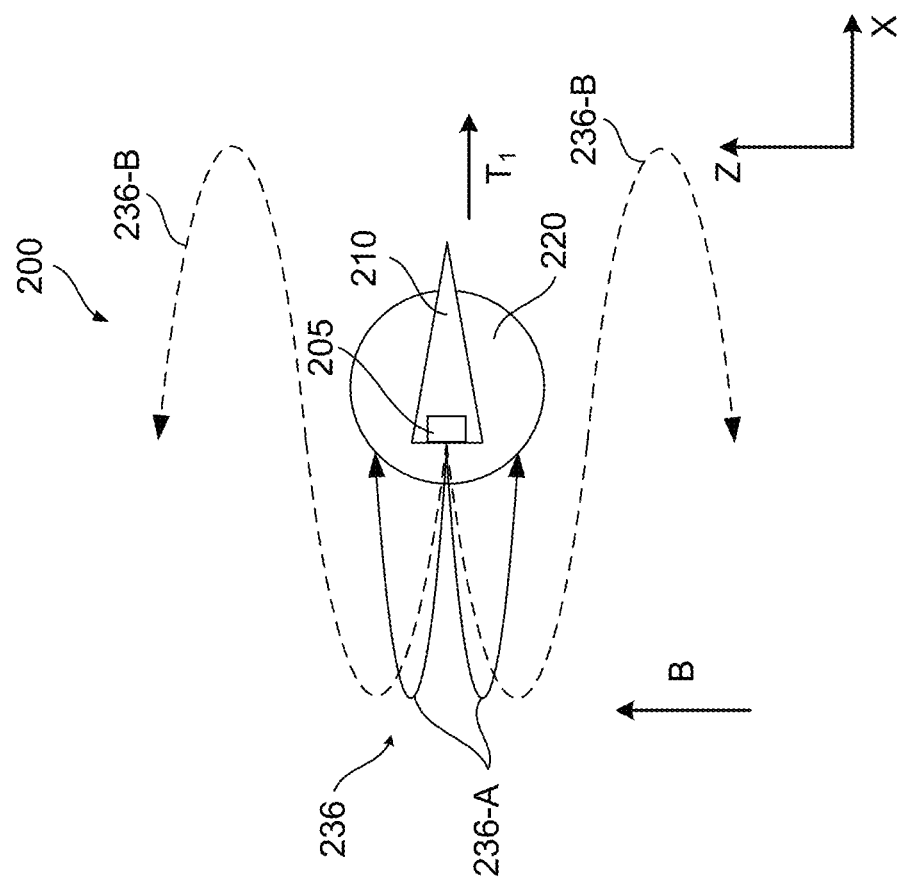
FIGS. 4A and 4B illustrate trajectory of ion exhaust emitted by an ion thruster, in accordance with an illustrative embodiment.
Figure 4A:
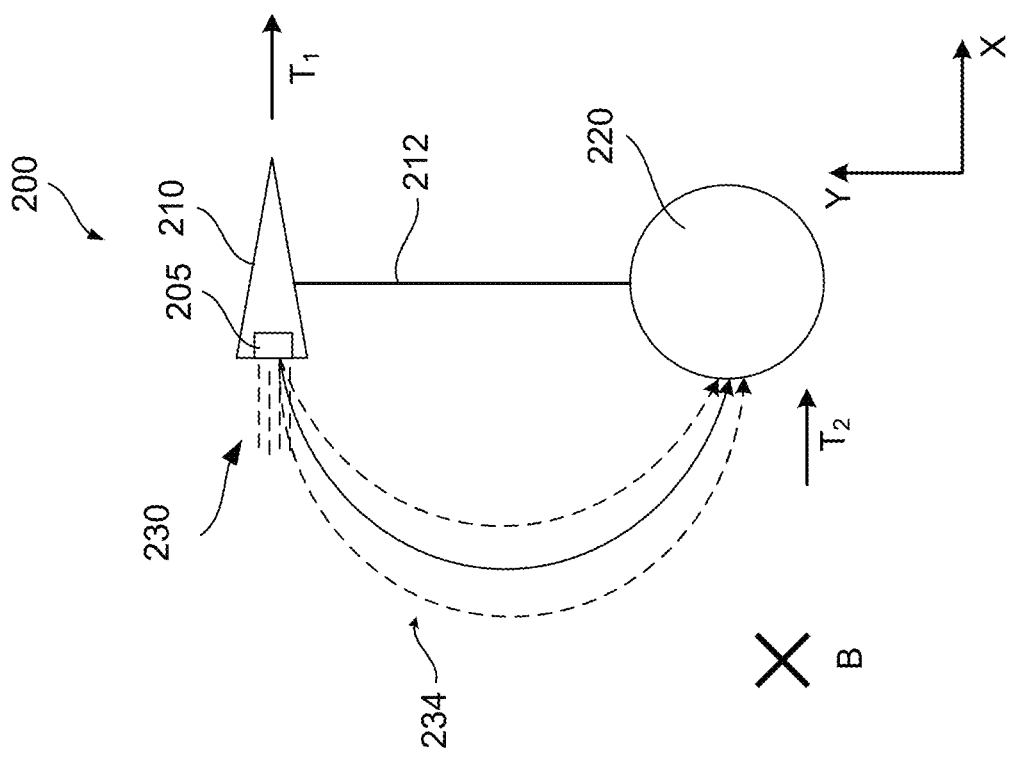

With reference to FIGS. 4A and 4B, shown are example trajectories of ion exhaust emitted by an ion thruster, in accordance with an illustrative embodiment. FIG. 4A depicts a side view of tethered spacecraft 200, and FIG. 4B depicts a top-down view of tethered spacecraft 200. FIG. 4A shows vertical trajectories 234 of the emitted collimated ion beam 230 diverging as a plume in the X-Y plane perpendicular to magnetic field B. The circular paths of different trajectories may include approximately the same diameter. As depicted in FIG. 4A, the dashed paths of trajectories 234 are 20° above and below the centerline trajectory. As shown, divergence in the vertical direction (along the X-Y plane) has little effect on thrust at the ion blocker because most ions will converge vertically after roughly half a revolution, where ion blocker 220 is situated. Thus, in some embodiments, ion blocker 220 with a relatively small height may block most emitted ions.

FIG. 4B shows lateral trajectories 236 of the emitted collimated ion beam 230 diverging as a plume in the X-Z plane parallel to magnetic field B. Such lateral beam divergence (divergence in the direction parallel to magnetic field lines) is greater than the vertical beam divergence. As depicted in FIG. 4B, emitted ions that start in a direction close to the beam centerline (trajectories 236-A) impact the ion blocker. However, ions farther from the centerline (trajectories 236-B) spiral around the magnetic field lines, do not converge, and miss the ion blocker. Thus, in some embodiments, ion blocker 220 may require a relatively large width (along the Z-axis) in order to block most ions.

FIGS. 4C and 4D illustrate an example ion plume 400 produced by an ion thruster, in accordance with one or more embodiments. For example, FIGS. 4C and 4D may depict a distribution of argon ions at the bottom of the curved trajectory with a specific impulse of 2000 seconds. In FIGS. 4C and 4D, boundary 402 represents the distribution of argon ions of the ion plume within 1 standard deviation (1σ), and boundary 404 represents the distribution of argon ions of the ion plume within 2 standard deviations (2σ). As shown, the differing effects of horizontal and vertical divergence causes the ions approaching the ion blocker to have a narrow vertical distribution (i.e., in the direction radial to the orbit and perpendicular to magnetic field B). Thus, in various embodiments, an efficient ion blocker may include a profile with that is much wider than it is tall, such as ion blocker 420, shown in FIG. 4D. For example, ion blocker 420 may comprise a cylinder with a length 422 of approximately 80 meters. By comparison, the Echo 2 satellite was a spherical balloon that was approximately 41 meters in diameter, and the Stratos 2 high-altitude balloon was approximately 129 meters in diameter.

Figure 5:
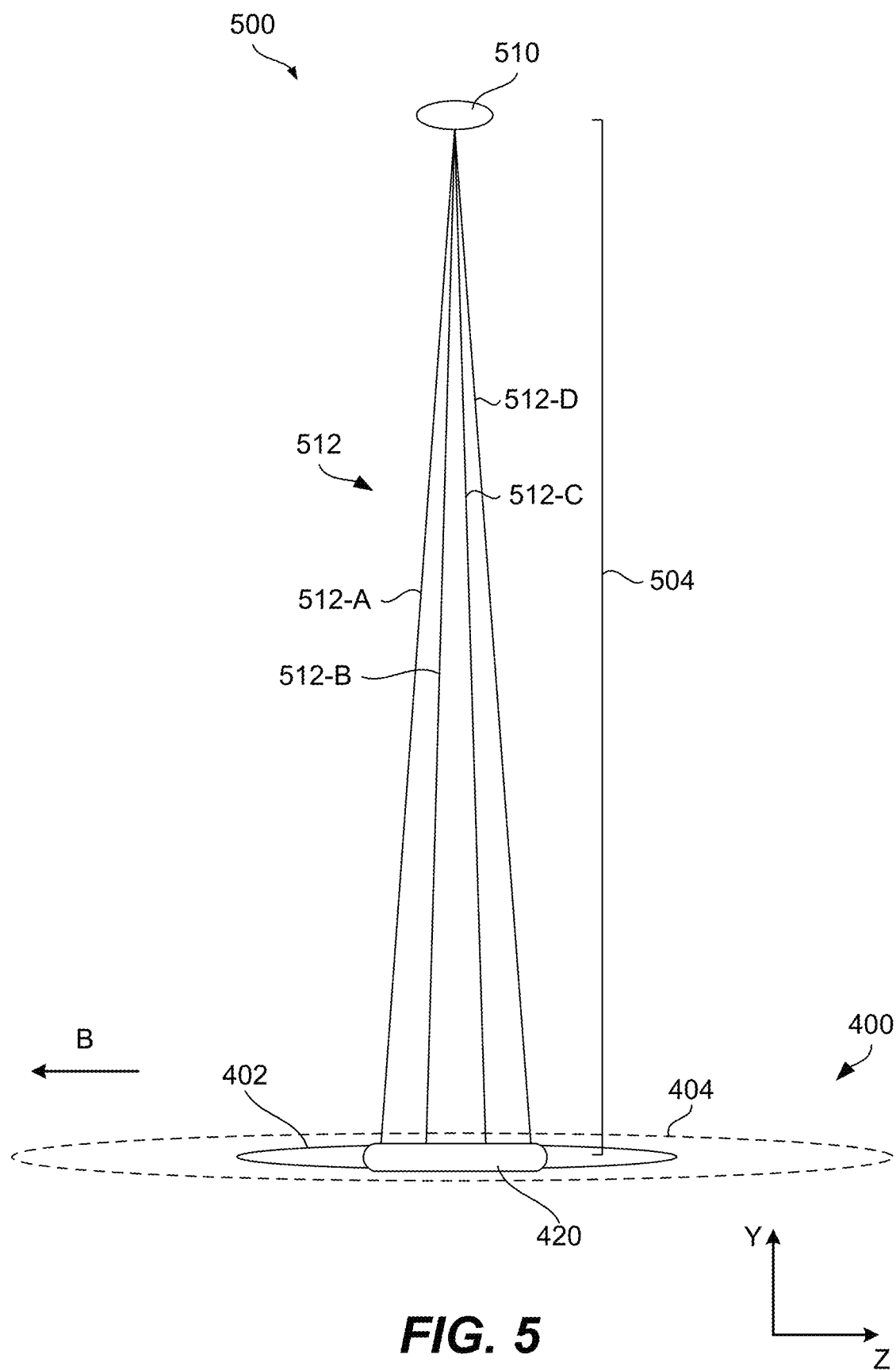
FIG. 5 illustrates a front view of an ion propelled spacecraft with a tethered ion blocker in relation to an ion plume, in accordance with an illustrative embodiment.

With reference to FIG. 5, shown is a front view of an ion propelled spacecraft 500 with a tethered ion blocker in relation to an ion plume 400, in accordance with an illustrative embodiment. In some embodiments, the ion blocker in FIG. 5 may be ion blocker 420. As an illustrative example, spacecraft 500 may be propelled by an argon ion thruster expelling ions at a relative velocity, $v_{rel}$ of 20 km/sec in a magnetic field, B, of 0.35 gauss. Thus, the gyroradius of the center of the emitted plume is 233 meters, so the center of ion blocker 420 may be deployed at twice the distance (distance 504) of 465 meters below the spacecraft. As such, ions within one standard deviation (402) of the emitted plume 400 pass within 113 meters laterally and 5.6 meters vertically from the center of blocker 420. In some embodiments, blocker 420 may comprise a cylindrical balloon with an aspect ratio of approximately 8:1. As depicted, blocker 420 is suspended from the body 510 of spacecraft 500 by four insulated tethers 512, including tethers 512-A, 512-B, 512-C, and 512-D. However, in some embodiments, more or fewer tethers may be implemented based on the geometry and configuration of the tethered system.

In the above examples, even with a very large ion blocker, some ions in the ion plume will miss the ion blocker. Thus, $\mu_2 > \mu_1$, indicating that thrust at the blocker ($T_2$) is less than the thrust at the spacecraft ($T_1$), in the examples discussed above. However, surface charge of the ion blocker may increase the thrust ($T_2$) at the ion blocker by bouncing impacting ions.

Electric Potential of Ion Blocker Surface

Figure 6:
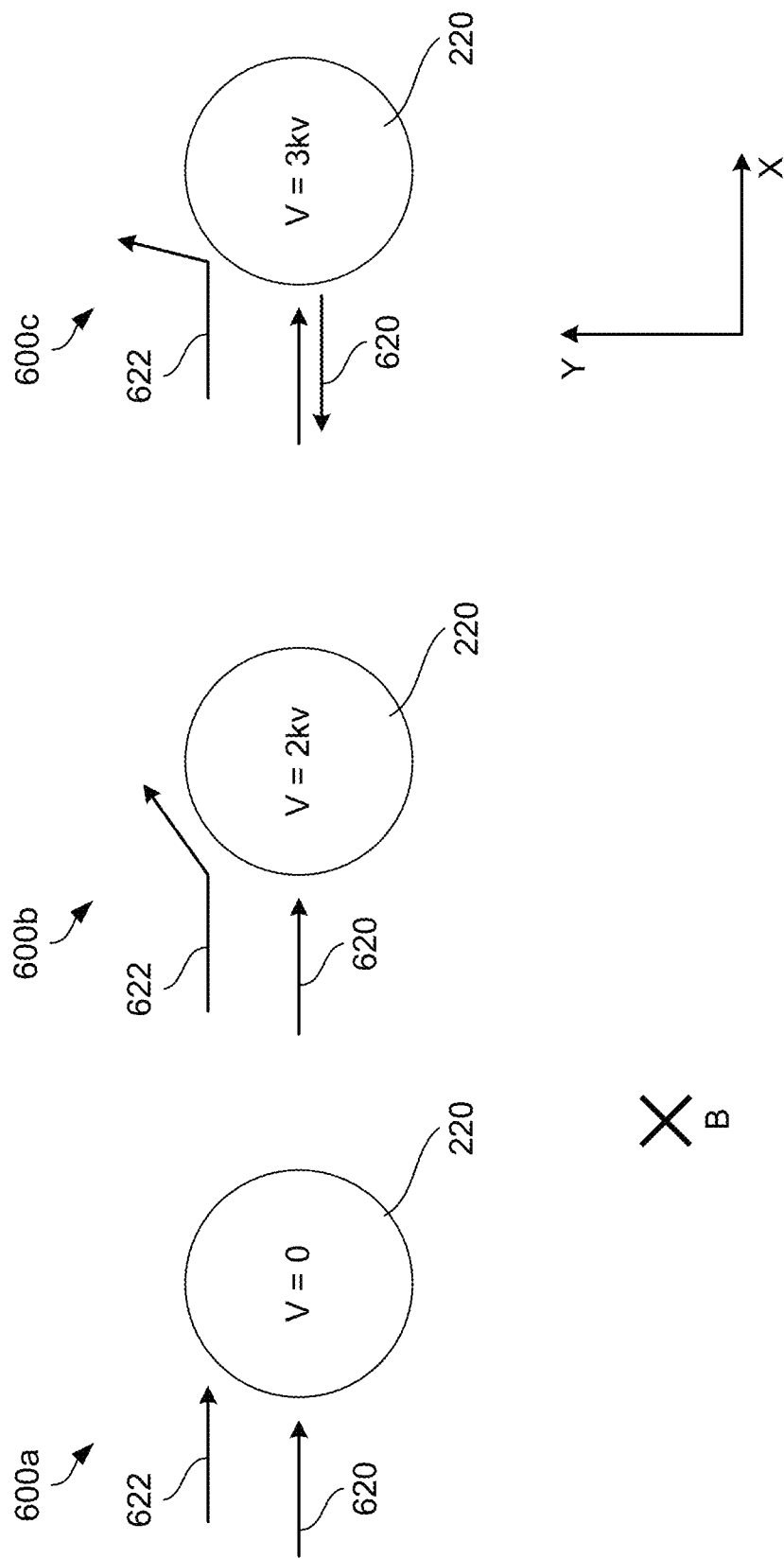
FIG. 6 illustrates an ion blocker at various levels of electric potential, in accordance with one or more embodiments.

The examples provided above assume that ions striking the blocker stick to the surface of the ion blocker and deliver momentum equal to $m_{ion}v_2$. However, as impacting ions builds charge on the surface of the ion blocker, subsequent striking ions may be deflected before making contact with the surface of the ion blocker. FIG. 6 illustrates an ion blocker at various levels of electric potential, in accordance with one or more embodiments. For example, the ion blocker depicted in FIG. 6 may be ion blocker 220. FIG. 6 depicts side views of ion blocker 220 and times 600a, 600b, and 600c.

At 600a, the ion blocker is first deployed and has zero charge and zero electric potential. Thus, at time 600a, the surface of the ion blocker has an electric potential (V) of zero volts. Approaching ions are shown by trajectory 620 (heading toward the center of the ion blocker) and trajectory 622 (heading toward the periphery of the ion blocker). As the arriving ions strike the surface of the ion blocker and deliver charge in addition to momentum.

Charges accumulate on the ion blocker and raise the electric potential to moderate levels at 600b. At 600b, the surface of the ion blocker has an intermediate electric potential (V), such as 2 kilovolts (kV) for example. As such, ions headed for the center of the ion blocker (trajectory 620) still approach with sufficient momentum to strike the surface and delivery charge. However, ions headed for the periphery of the ion blocker (trajectory 622) may be deflected by the electric field of the ion blocker. Although deflected ions miss the blocker, they still deliver some momentum because the velocity vectors of the deflected ions have changed direction.

In various instances, such a deflected ion may deliver as much momentum as an ion that strikes the ion blocker and sticks to the surface. However, such a deflected ion may deliver more or less momentum as an ion that strikes the ion blocker and sticks to the surface depending, at least in part, on the angle of deflection. The amount of momentum delivered may depend on the angle φ through which the ion is deflected. Where k=0, the curved ions miss the ion blocker and φ=0. Where k=1, the curved ions impact the blocker and stick to it. Where k=2, the curved ions are deflected 180° back in the opposite direction and φ=180°. Then the k value for deflected ions is given by k=1−cos(φ). For example, if ions are deflected at an angle from their original direction at φ=90°, then k=1, just as if the ions impacted and stuck to the surface of the ion blocker. In both of these cases, the forward velocity of the ion changes from $v_{ex}$ to zero.

Striking ions continue to build charge on the ion blocker's surface until the charge on the ion blocker is high enough that even an ion with a trajectory aimed at its center will be deflected without making contact. As shown, at 600c, the electric potential (V) of the ion blocker has reached a maximum potential and cause ions arriving at both trajectories 620 and 622 to be deflected. For example, the maximum potential of the surface of the ion blocker may be 3 kV. However, in some embodiments, the maximum potential of the ion blocker surface may be greater or lower than 3 kV. With this higher electric potential, ions traveling along trajectory 622 at the periphery of the ion blocker are deflected to a greater extent, and deliver more momentum compared to the same trajectory at 600*b*. Thus, at 600*b*, the coefficient k may be between 2 and 3 in an ideal system.

Additionally, at 600*c*, ions traveling along trajectory 620 are deflected in the opposite direction by the increased electric potential of the surface. Thus, ions along trajectory 620 change velocity vectors from $v_{ex}$ forward to $v_{ex}$ backward. Such change in velocity delivers momentum to the ion blocker equal to $2m_{ion}v_{ex}$ for each deflected ion. This is twice as much momentum as an arriving ion that sticks to the ion blocker.

In some embodiments, the deflection of ions at maximum electrical potential may double, or nearly double, the thrust produced by at the ion blocker. In some embodiments, an ion blocker with a flat contact surface can bounce a large fraction of ions at nearly 180°. However, a spherical or cylindrical blocker would provide a smaller increase in thrust as most ions would be deflected at less than 180° and deliver less momentum.

In various embodiments, the surface of the ion blocker is metallized or otherwise made conductive. A conductive surface would allow the entire surface to rise to the highest possible electric potential (i.e., the potential that stops an ion arriving perpendicularly at the surface). Additionally, such conductive (or metallized) surface would provide a larger deflection (deflection at larger angles) of ions passing near the ion blocker, transferring more momentum. Without a conductive surface, only portions of the surface that are perpendicular to the incoming ion beam would reach the highest potential, and every other area on the surface would only reach a high enough potential to stop ions from hitting that area. As such, ions headed for the periphery of the ion blocker would be deflected through smaller angles and would transfer less momentum to the ion blocker.

The explanation above assumes that the surface of the ion blocker can reach an electric potential as high as the most energetic ions from the thruster. However, practical application of the ion blocker may result in lower maximum electric potential. For example, maintaining high electric potential on a spacecraft surface may pose several challenges, such as electric arc formation. Also, electrons from the ionosphere may also deplete the charge at a rate depending on local electron density. Various embodiments, may utilize a lower electric potential on the surface of the ion blocker to minimize such challenges, while gaining some added thrust from bouncing or deflecting a portion of the ions.

The motion of the spacecraft may also factor into maximizing thrust produced at the ion blocker. The previous explanations assume that the emitted ions move so fast that spacecraft motion can be ignored. However, the emitted ions have a finite speed, typically about 30 km/sec. The motion of the spacecraft and the blocker may be approximately 7 to 8 km/sec. Thus, interaction between the ions and the blocker are affected in terms of impact speed, gyroradius, and convergence location.

With regards to impact speed, reference is made back to FIG. 2. Provided below are modified system equations to model an orbital velocity perpendicular to the magnetic field (such as an orbit-raising maneuver in equatorial orbit).

Thrust ($T_1$) created by the thruster is modeled as $T_1=\mu_1 v_{ex}$ where $\mu_1$ is the mass flow rate of ions leaving the spacecraft, and $v_{ex}$ is the exhaust velocity of the ions.

The relative velocity ($v_{rel}$) of the ions relative to the magnetic field is modeled as $v_{rel}=v_{ex}-v_{orb}$, where $v_{orb}$ is the orbital velocity of the spacecraft, such as in direction of arrow 202 for example.

The impact speed of the ions at the ion blocker ($v_2$) is defined as $v_2=v_{rel}-v_{orb}=v_{ex}-2v_{orb}$ Thrust at the ion blocker ($T_2$) is calculated as $T_2=\mu_2 v_2=k\mu_1 v_2$.

In an example embodiment, if $v_{ex}=30$ km/sec and $v_{orb}=7.7$ km/sec, then impact speed ($v_2$) and thrust ($T_2$) at the ion blocker are:

$$v_2=v_{ex}-2v_{orb}=30 \text{ km/sec}-2(7.7 \text{ km/sec})=14.6 \text{ km/sec}$$

$$T_2=k\mu_1 v_2=k\mu_1(14.6 \text{ km/sec})$$

Comparing this to the thrust ($T_1$) produced by the thruster gives:

$$\frac{T_2}{T_1} = \frac{k\mu_1(14.6 \text{ km/sec})}{\mu_1(30 \text{ km/sec})} = k0.49$$

Thus, even if all ions emitted by the ion thruster strike the ion blocker (such that k=1), the ion blocker would provide a maximum of about 49% more impulse than the ion thruster alone. This amount would double to 98% if all the ions are deflected from the blocker at 180° due to the electric potential of the ion blocker.

With respect to the gyroradius, the actual gyroradius of the ion trajectory is smaller due to the relative velocity ($v_{rel}$) of the ions relative to the magnetic field. As shown by the equation $v_{rel}=v_{ex}-v_{orb}$, the relative velocity ($v_{rel}$) is lower than the exhaust velocity ($v_{ex}$). In the example above, $v_{rel}=30-7.7$ km/sec=22.3 km/sec, so the gyroradius is 22.3/30=74% as large compared to if spacecraft motion was not accounted for. Thus, in particular embodiments, a tether that is 74% as long and a blocker that is about $(22.3/30)^2=55\%$ as large in area can be implemented given the system values above. This would also reduce the weight of the ion blocker by approximately 55%.

Spacecraft Motion

With respect to convergence location, the distance moved by the ion blocker while the ions gyrate must also be factored in. The amount of ions striking the ion blocker may be increased by modifying the direction of the velocity vector of the emitted ions ($v_{ex}$) or by modifying the length of the tether, as further described with reference to FIGS. 7A and 7B. FIGS. 7A and 7B illustrate schematic views of convergence locations of different trajectories of ion exhaust emitted by an ion thruster, in accordance with one or more embodiments.

As shown in FIGS. 7A and 7B, the spacecraft 200 at time t is represented by body 210, tether 212, and ion blocker 220. The spacecraft at time t+1 is represented by body 210*a*, tether 212*a*, and ion blocker 220*a*. In some embodiments, the ion thruster emits ion beam 230 at time t in a direction that is parallel to the X-axis and travel in a plume with trajectory 234, as depicted in FIG. 7A. The dashed paths 234*a* and 234*b* of trajectory 234 show ion paths above and below the centerline 234*c* of trajectory 234, respectively. As further illustrated in FIG. 7A, by time t+1, when the ions in the plume are directly below their starting position, ion blocker 220 has moved forward to the position shown by ion blocker 220*a*. Thus, the ions must travel several more degrees around the circular trajectory before reaching ion blocker 220a. As a result, ions that were emitted substantially above the beam's centerline (path 234a) will pass above the ion blocker (220a), reducing the overall thrust imparted onto the ion blocker.

In some embodiments, additional ions may be captured by shortening the length of the tether to account for the additional travel distance of the ions, as will be further described below. In some embodiments, the thruster may be configured to emit the ion beam downward, as shown in FIG. 7B. FIG. 7B shows spacecraft 200 emitting ion beam 230a in a direction that is angled downward with respect to the X-axis to shift the trajectory of the ion plume 234 downward. For example, the thruster may be aimed downward by about 20°. The shifted trajectory of the ion plume 234 causes ions emitted at time t in paths 234a and 234b, in addition to the centerline trajectory, to be captured by the ion blocker at time t+1.

The actual angle may vary depending on the ion exhaust velocity $v_{ex}$ and the molecular mass of the emitted ions. Note that these changes to impact speed, gyroradius, and convergence location may not apply if the spacecraft is traveling parallel to the magnetic field lines, e.g., in a high-inclination orbit, and thrusting perpendicular to the direction of travel to perform a plane change.

Ion Blocker Stability

Figure 8B:
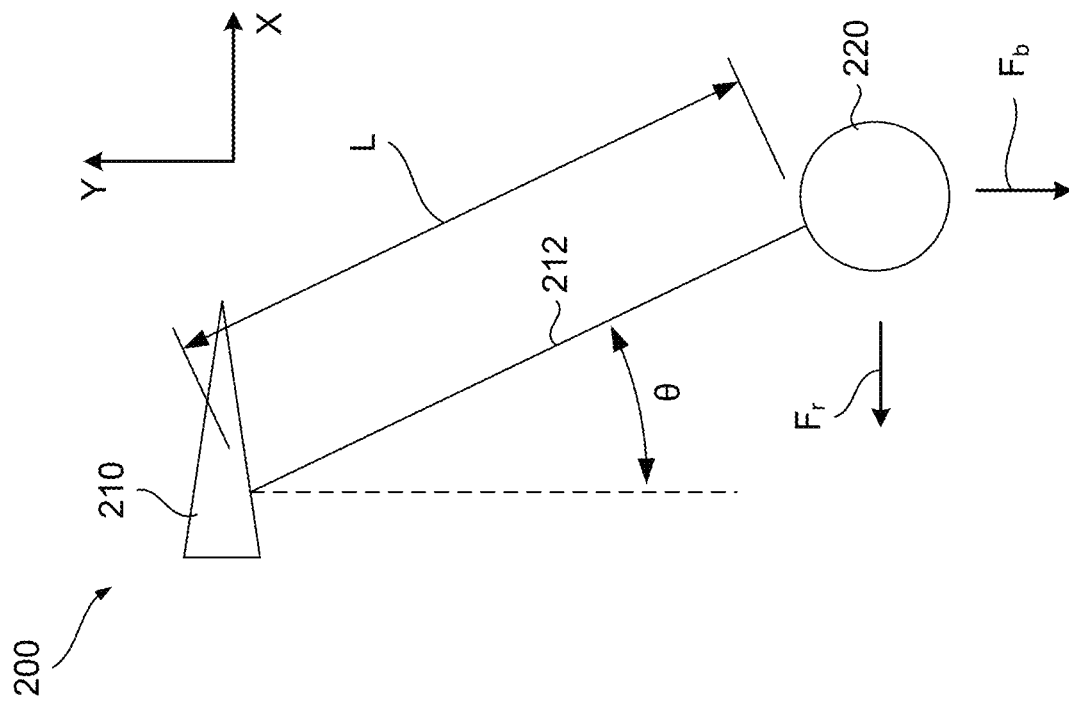
FIGS. 8A and 8B illustrate schematic views of the longitudinal position of a tethered ion blocker, in accordance with one or more embodiments.
Figure 8A:
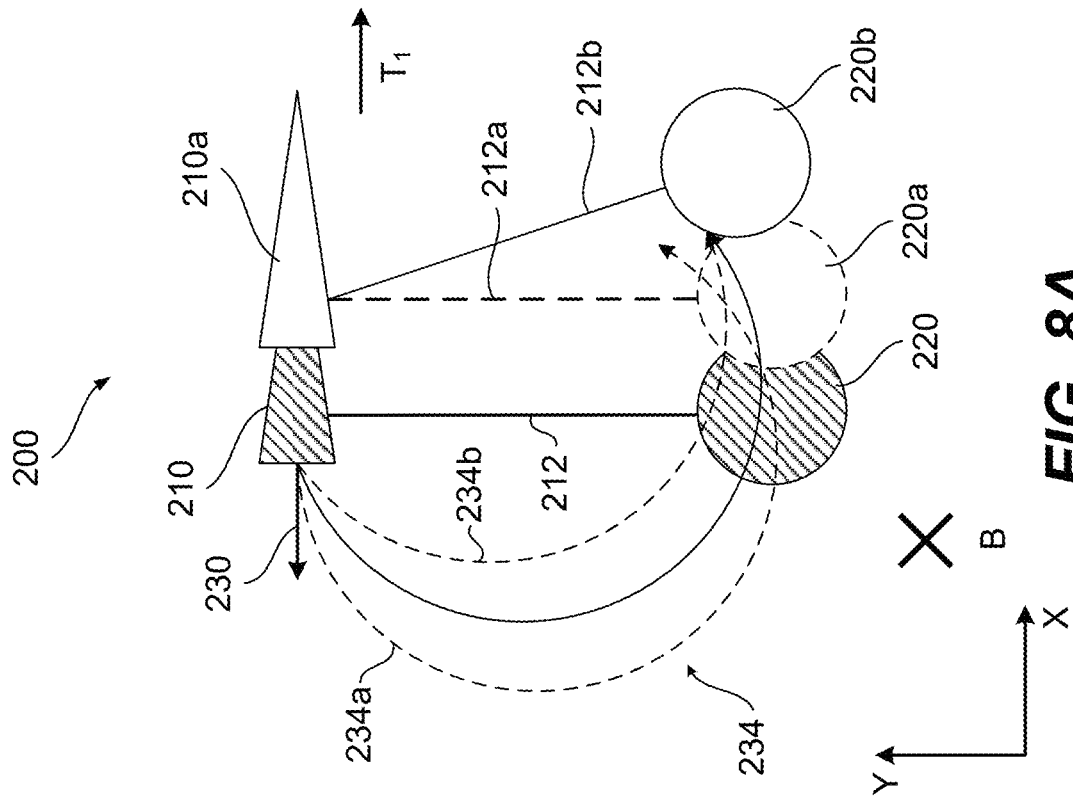

In some embodiments, the tethers and the ion blocker have a low enough mass such that the thrust on them produced by the ions will push them into a new position with respect to the spacecraft. The stability of the ion blocker is discussed with reference to FIGS. 8A-8B and FIGS. 9A-9D. FIGS. 8A and 8B illustrate schematic views of the longitudinal position of a tethered ion blocker, in accordance with one or more embodiments. Similar to FIG. 7A, in FIG. 8A, the spacecraft at time t is represented by body 210, tether 212, and ion blocker 220. The spacecraft at time t+1 is represented by body 210a, tether 212a, and ion blocker 220a. In some embodiments, the ion thruster emits ion beam 230 at time t in a direction that is parallel to the X-axis and travel in a plume with trajectory 234, as depicted in FIG. 8A. The dashed paths 234a and 234b of trajectory 234 show ion paths above and below the centerline trajectory, respectively.

As previously explained, by time t+1, ion blocker 220 has moved forward to the position shown by ion blocker 220a. The ion blocker may further move ahead of body 210a and ion blocker 220a, as represented by ion blocker 220b and tether 212b, if the ion blocker's thrust to mass ratio is greater than that of the spacecraft, causing the tether to tilt out of the vertical (with respect to the Y-axis). This also causes the ions to travel several more degrees around the circular trajectory before reaching ion blocker 220b. As a result, ions that were emitted substantially above the beam's centerline (path 234a) will pass above the ion blocker (220b), reducing the overall thrust imparted onto the ion blocker.

However, restoring forces may prevent the blocker from continuing to move further ahead of the spacecraft. For example, the gravity gradient force on the ion blocker from the planet may restore the tether to vertical. FIG. 8B illustrates forces on the ion blocker. Provided that ion blocker 220 includes a mass $m_b$, g' is the gravity gradient, L is the length of tether 212, and θ is the angle of tilt of the tether from vertical, then the restoring force $F_r$ is defined as:

$F_r = m_b g' L \sin θ$ and the gravitational force $F_b$ on the blocker is defined as:

$F_b = m_b g' L \cos θ$

Restoring force $F_r$ may tend to be stronger than the deflecting force when exhaust velocity $v_{ex}$ of the ion beam is high. The deflecting force, ~k m_dot $v_{ex}$, is roughly linear with $v_{ex}$, while the restoring force $F_r$ scales as L $m_b$. The tether length L scales linearly with $v_{ex}$. The mass of the ion blocker $m_b$ is roughly proportional to the length and width of the ion blocker, both of which scale linearly with $v_{ex}$, such that the mass $m_b$ scales as $(v_{ex})^2$. Thus, the restoring force $F_r$, which scales as L $m_b$, is roughly proportional to $(v_{ex})^3$. As a result, operation of the ion thruster at high $v_{ex}$ makes the restoring force $F_r$ much greater than the deflecting force imparted by the ions.

However, several operational adjustments may be implemented in order to remain stable during operation at low $v_{ex}$. First, the mass $m_b$ of the ion blocker may be increased to increase the restoring force $F_r$. Alternatively, the μ of the ions may be reduced to reduce the deflecting force. As another option, the tether may be allowed to tilt forward, as in FIG. 8A, until enough ions miss the blocker to reduce the total deflecting force to equilibrium with the restoring force $F_r$. In some embodiments, a combination of one or more of such operational adjustments may be implemented.

In some embodiments, the tether and ion blocker may remain deployed over the duration of the mission or life of the spacecraft. In some embodiments, the ion blocker may be deployed from the spacecraft when a maneuver is desired or if additional thrust is needed. The ion blocker may then be retracted once the maneuver or thrust has been completed. In some embodiments, the ion blocker may be retracted into the spacecraft after the maneuver or thrust has been completed. However, in some embodiments, the ion blocker may be retracted to a predetermined proximal position exterior to the spacecraft when not in operation. In some embodiments, the tether system and/or ion blocker may be jettisoned from the spacecraft when the maneuver or thrust has been completed.

Figure 8C:
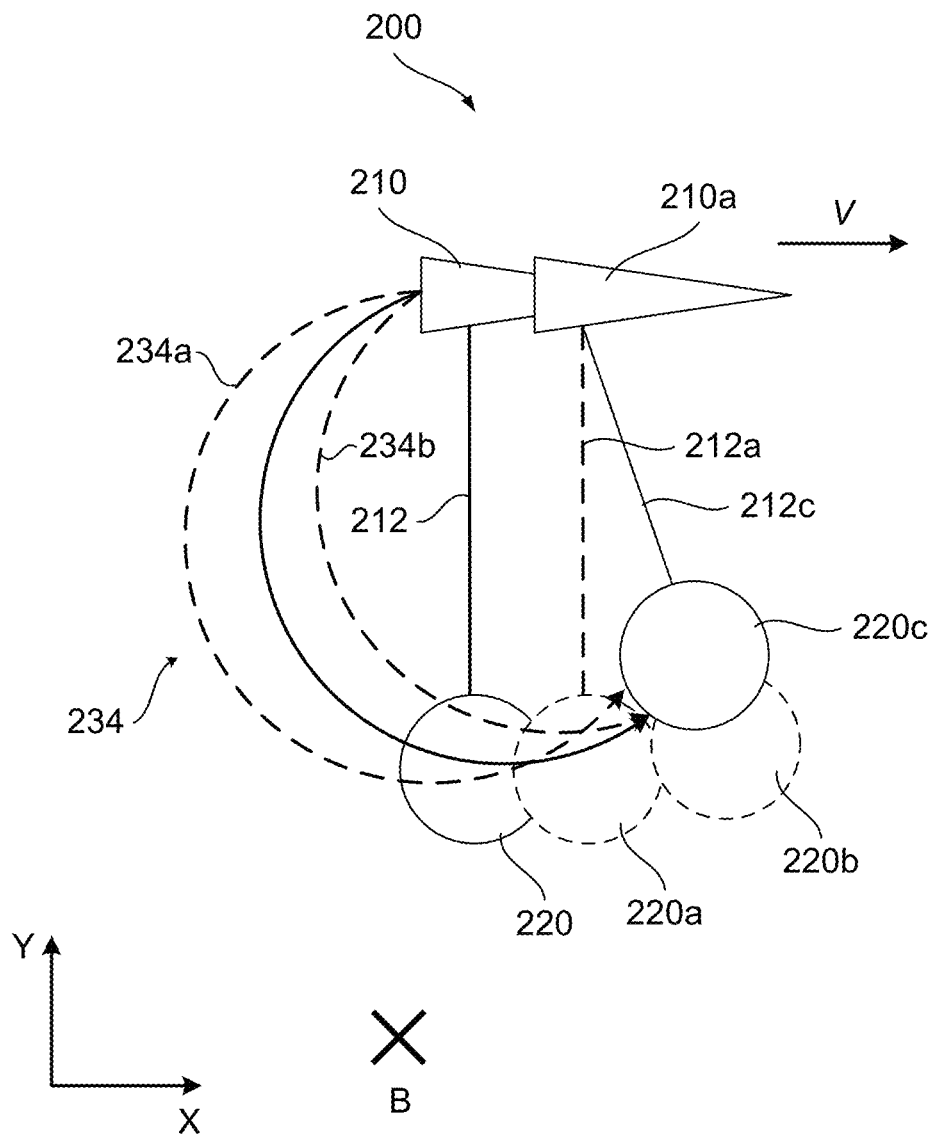
FIG. 8C illustrates a tethered ion blocker with an adjusted length, in accordance with one or more embodiments.

As previously described, the length of the tethers of the tether system may be variable and controlled by a reel system or other suitable deployment system. The length of the tethers may be adjusted to handle changes in the magnetic field (e.g., direction or strength), to damp out oscillations, to handle variations in the tilt of the ion blocker, or any combination of such considerations. FIG. 8C illustrates a tethered ion blocker with an adjustable length, in accordance with one or more embodiments.

Ion blocker 220c represents the position of the ion blocker that has been pushed forward by the impacting ions at time t+1 in a retracted position (shown by retracted tether 212c). In the retracted position (220c), the ion blocker is able to catch more of the ions, including ions traveling along paths 234a and 234b that are above and below the centerline trajectory of the ion beam. As such, adjustments in the direction or exhaust velocity of the ion beam. In some embodiments, adjustment of the tether length may be implemented in conjunction with modifications in the direction and/or exhaust velocity of the ion beam to increase or decrease the amount of ions impacting the ion blocker.

Figure 9C:
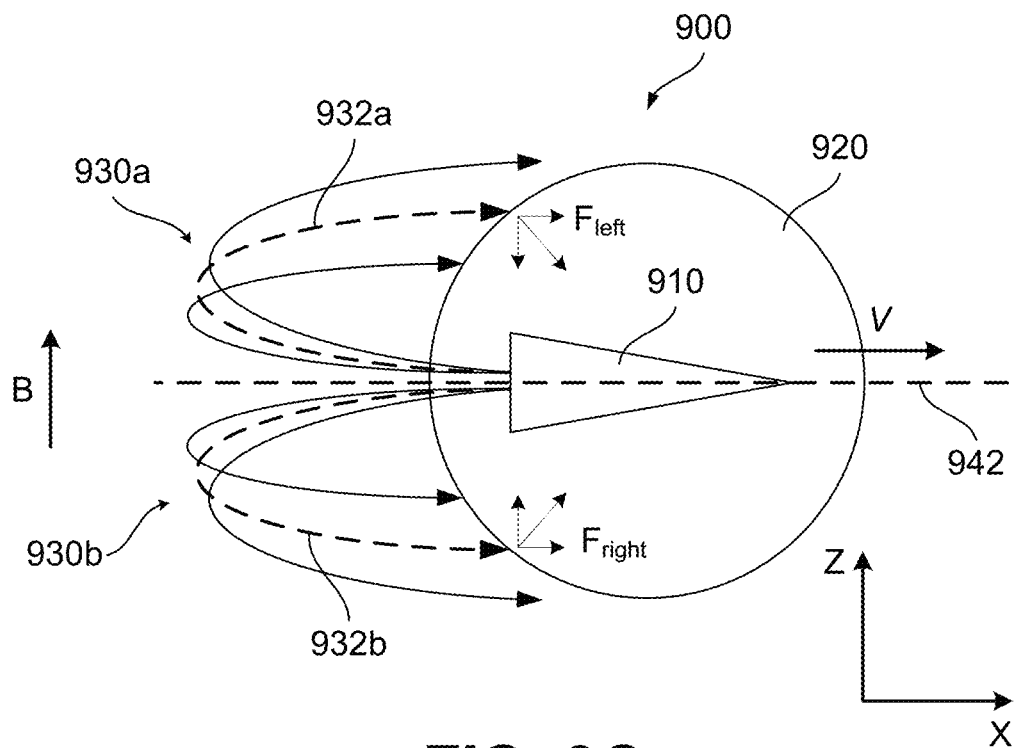

In various embodiments, lateral stability of the ion blocker (along the Z-axis) is also a consideration. FIGS. 9A, 9B, 9C, and 9D illustrate schematic views of the lateral position of a tethered ion blocker, in accordance with one or more embodiments. FIGS. 9A-9D show blocker 920 with a convex contact surface 925. For purposes of illustration, blocker 920 is depicted as a spherical ion blocker. FIG. 9A shows ion blocker 920 centered with the ion beam such that the center 932 of the ion beam 930 is aligned with centerline 940 of blocker 920, providing thrust 950 on the ion blocker that is parallel to the beam 930. FIG. 9B shows ion beam 930 that is off-center from centerline 940 of the ion blocker, such that the center 932 of the ion beam 930 is off centerline 940 by a distance of $\Delta z$. This off-center ion beam produces a lateral force (thrust 952) that pushes ion blocker 920 even farther off-center.

While restoring forces, such as those described with reference to FIGS. 8A and 8B, may act to re-center the ion blocker with respect to the ion beam, in some cases, such restoring forces may be insufficient. A combination of one or more of the following solutions may be implemented to restore the ion blocker toward the center of the ion beam.

One solution is to yaw the spacecraft, or gimbal the thruster, laterally (along the Z-axis such that the ion beam strikes the ion blocker farther off-center than the ion blocker has moved. This may produce a lateral restoring force. In various embodiments, the ion thruster may also be configured to be steered laterally to deal with changes in the orientation of the magnetic field.

Figure 9D:
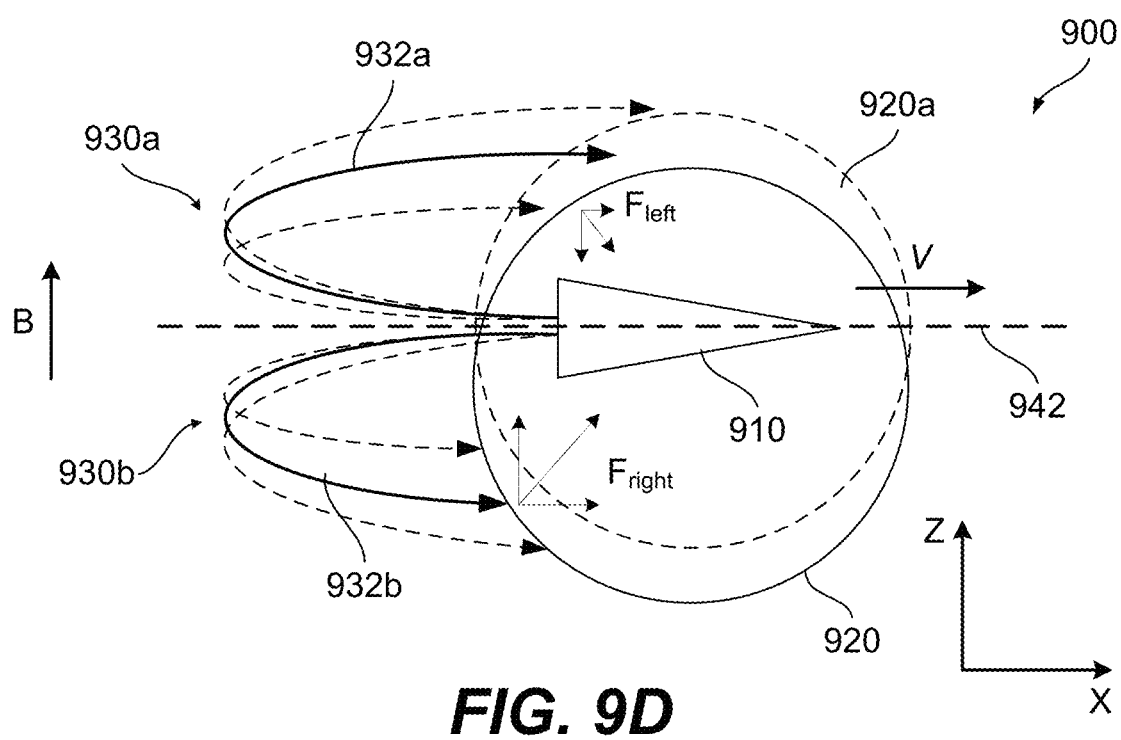

As another example, the ion thruster of the spacecraft is configured to emit a double plume of ions that diverge laterally along the Z-axis. FIGS. 9C and 9D show an example spacecraft 900 with emitting an ion beam with laterally diverging plumes from body 910. Spacecraft 900 emits diverging ion plumes 930a and 930b. Instead of one central peak flux, the double plume has two peaks fluxes that diverge laterally. The peak flux for each ion plume is shown as a solid arrow, with peak flux 932a of left ion plume 930a and peak flux 932b of right ion plume 930b. In some embodiments, after half a gyration of the ion beam trajectories, the peak fluxes are separated by nearly the width of the ion blocker.

FIG. 9C illustrates ion blocker 920 which is centered along midline axis 942 between the two diverging plumes such that the plumes delivery laterally-balanced forces $F_{left}$ and $F_{right}$. FIG. 9D illustrates ion blocker 920 that is off-center from midline axis 942. The previous position of the ion blocker 920a is shown in dashed lines. The ion plumes deliver lateral restoring force when blocker is off-center. When the ion blocker moves off-center from midline axis 942 in either direction, it moves out of one ion plume (such as left plume 930a) and into the other plume (such as right plume 930b). The ion blocker will then experience increased force from peak flux 932b of right plume 930b, increasing the force $F_{right}$ on the ion blocker which produces a lateral force that restores the ion blocker toward the center of midline axis 942.

Finally, the ion blocker may be re-centered by throttling the ion thruster. For example, when the ion blocker begins to move off-center, the current to the ion thruster may be reduced which reduces the number of ions emitted for a given time, and thereby reduces the force from the ion beam pushing the ion blocker off-center, allowing the ion blocker to move back toward the center by restoring forces, such as gravity from a planet. As the ion blocker moves back to center, current to the ion thruster may be increased. This may produce a force that slows the ion blocker's movement towards the center and brings it to a stop at the center.

Figure 10B:
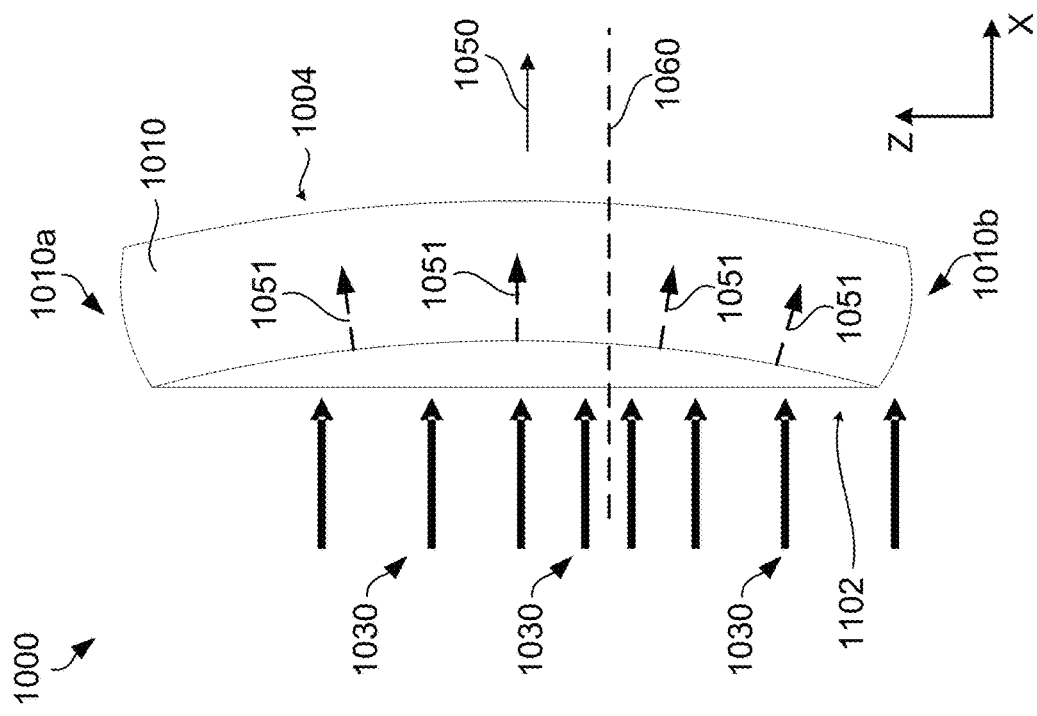
FIGS. 10A and 10B illustrate an ion blocker with a swept profile, in accordance with one or more embodiments.
Figure 10A:
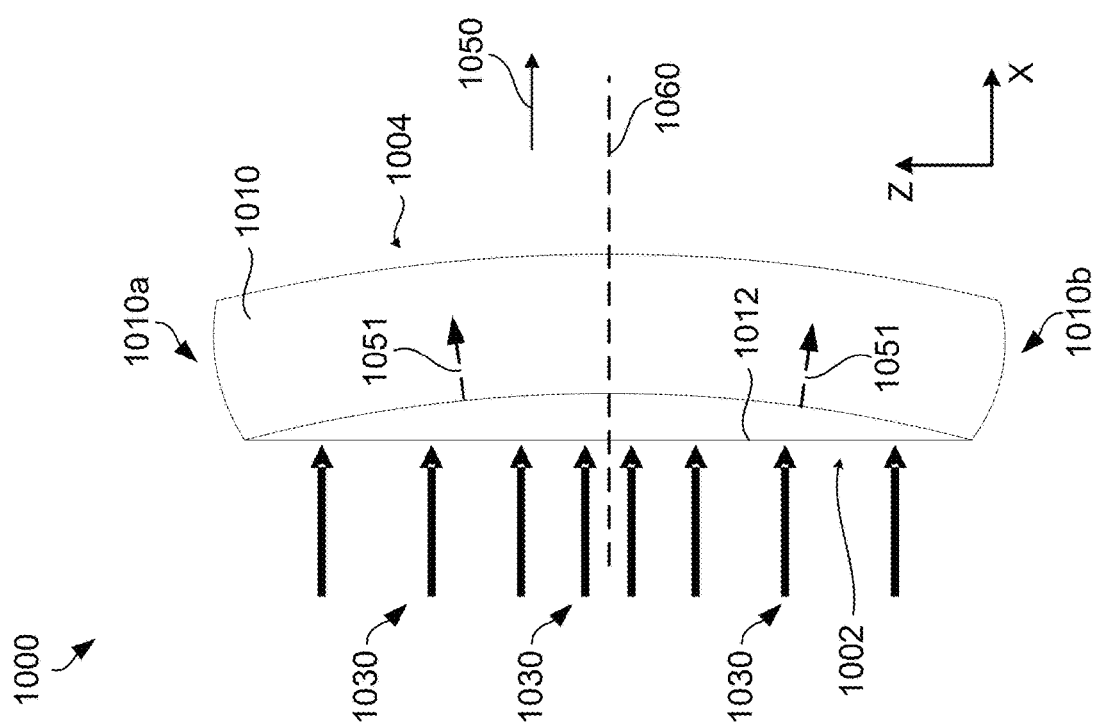

In some embodiments, the contact surface of the ion blocker may comprise a slightly swept profile to improve yaw stability and positioning of the ion blocker. FIGS. 10A and 10B illustrate an ion blocker 1000 with a swept profile, in accordance with one or more embodiments. FIG. 10A shows a top view of ion blocker 1000 centered on the ion beam. FIG. 10B shows a top view of ion blocker 1000 in an off-center position. In various embodiments, ion blocker 1000 is an inflatable cylindrical balloon structure with a forward surface 1004 and a rear contact surface 1002 facing ion beam 1030. In some embodiments, rear contact surface 1010 comprises a swept profile which is concave relative to approaching ion beam 1030.

In some embodiments, the swept profile is maintained by the skin of the balloon structure. In some embodiments, this swept profile is supported by one or more cords 1012 which are coupled to opposite lateral ends 1010a and 1010b of ion blocker 1000 and are under tension. In some embodiments, cords 1012 are electrically insulated. Alternatively, cords 1012 may be conductive to build electric potential to further block, deflect, and/or bounce approaching ions. In some embodiments, cords 1012 are adjustable in length to control the degree of concavity of the rear contact surface.

Although a cylindrical balloon structure is shown, ion blocker 1000 may be a sheet or sail having the same swept profile. For example, ion blocker 1000 may comprise a thin sheet with front surface 1004 and rear contact surface 1002 being opposite sides of the sheet. The swept profile may be maintained by the force of impacting or deflected ions and one or more cords connecting the lateral ends of the sheet.

The ion beam (arrows 1030) approaches and impacts rear contact surface 1002 to generate thrust 1050 along the X-axis. As depicted, the density of ion beam 1030 is indicated by the distance between the arrows. For example, a smaller distance between arrows represents a higher density of ions within the ion beam. As such, the beam density is the greatest near the central axis 1060 of the ion beam. As shown in FIG. 10A, ion blocker 1000 is centered upon central axis 1060 of the ion beam.

In various embodiments, as a result of the swept shape of contact surface 1002, impacting ions generate forces 1051 with lateral components, which function to stabilize the lateral positioning of the ion blocker. For example, during operation, ion blocker 1000 may shift toward the left (upward on the page) causing the right end 1010b to move toward the greater concentration of ions at central axis 1060. Thus, the majority of the ions in the ion beam will be concentrated toward the right side of ion blocker 1000. Due to the concave contact surface 1002 relative to the ion beam, forces 1051 toward the right end 1010b of the ion blocker are greater than forces 1051 toward left end 1010a. Thus, a net lateral restoring force is generated forcing the ion blocker to the right back to the central axis 1060.

Figure 11C:
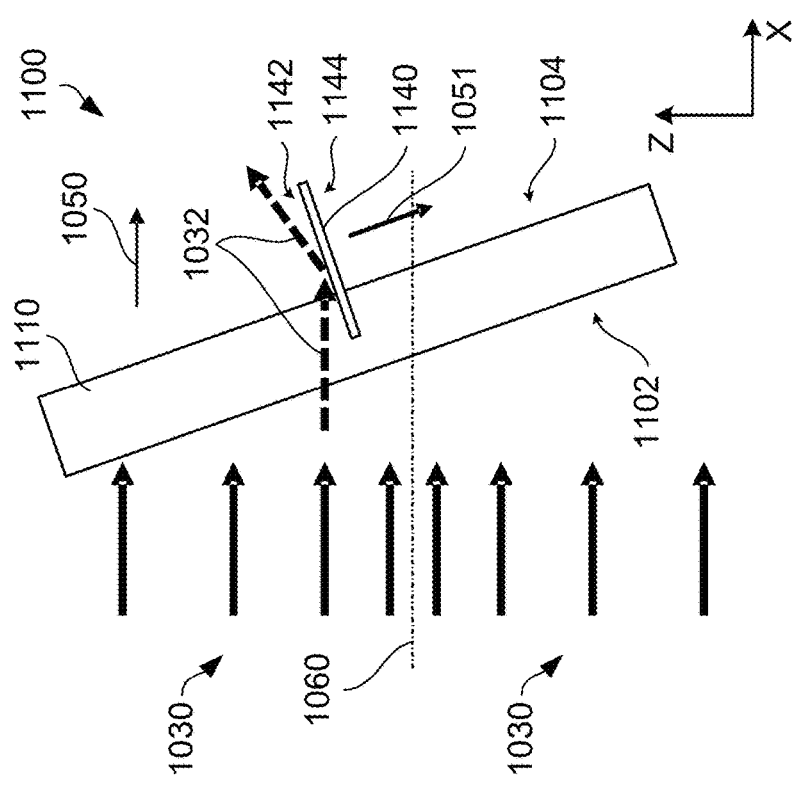

In some embodiments, the ion blocker may be configured with a vertical stabilizer placed behind the ion blocker. FIGS. 11A, 11B, and 11C illustrate an ion blocker 1100 with a vertical stabilizer 1140, in accordance with one or more embodiments. FIG. 11A shows a top view of ion blocker 1100 centered on the ion beam. FIG. 11B shows a side view of ion blocker 1100. FIG. 11C shows a top view of ion blocker 1100 in an off-center position. In some embodiments, ion blocker 1100 may include a body 1110 with a front surface 1104 and a rear contact surface 1102 having an un-swept profile. However, a vertical stabilizer 1140 may also be implemented with an ion blocker with a swept surface.

As previously described, ion beam (arrows 1030) approaches and impacts rear contact surface 1102 to generate thrust 1050 along the X-axis. As depicted, the density of ion beam 1030 is indicated by the distance between the arrows. For example, a smaller distance between arrows represents a higher density of ions within the ion beam. As such, the beam density is the greatest near the central axis 1060 of the ion beam. As shown in FIG. 11A, ion blocker 1100 is centered upon center axis 1060 of the ion beam.

As shown, in some embodiments, vertical stabilizer 1140 is a substantially flat structure that extends forward, upward, and downward from the center of the body 1110 of ion blocker 1100. Vertical stabilizer may include left surface 1142 and right surface 1144. As shown in the FIG. 11B, the vertical stabilizer extends above and below ion blocker 1100. Right surface 1144 is shown in FIG. 11B. As the ion blocker moves off-center (shown in FIG. 11C), ion blocker 1100 may begin to yaw toward the direction of travel (upward in the page). This would expose the surface of the vertical stabilizer to ions passing over or under the ion blocker 1100 and produce a lateral restoring force 1051 back toward the center of the ion beam. For example, additional surface area of left surface 1142 is exposed to the ion beam such that ions strike left surface 1142 (shown as dashed arrows 1032). The off-center deflection force 1051 from the ion beam includes a lateral component which causes the ion blocker to travel back toward the beam central axis 1060. The restoring force may also cause the ion blocker to yaw toward the beam central axis 1060.

Figure 12A:
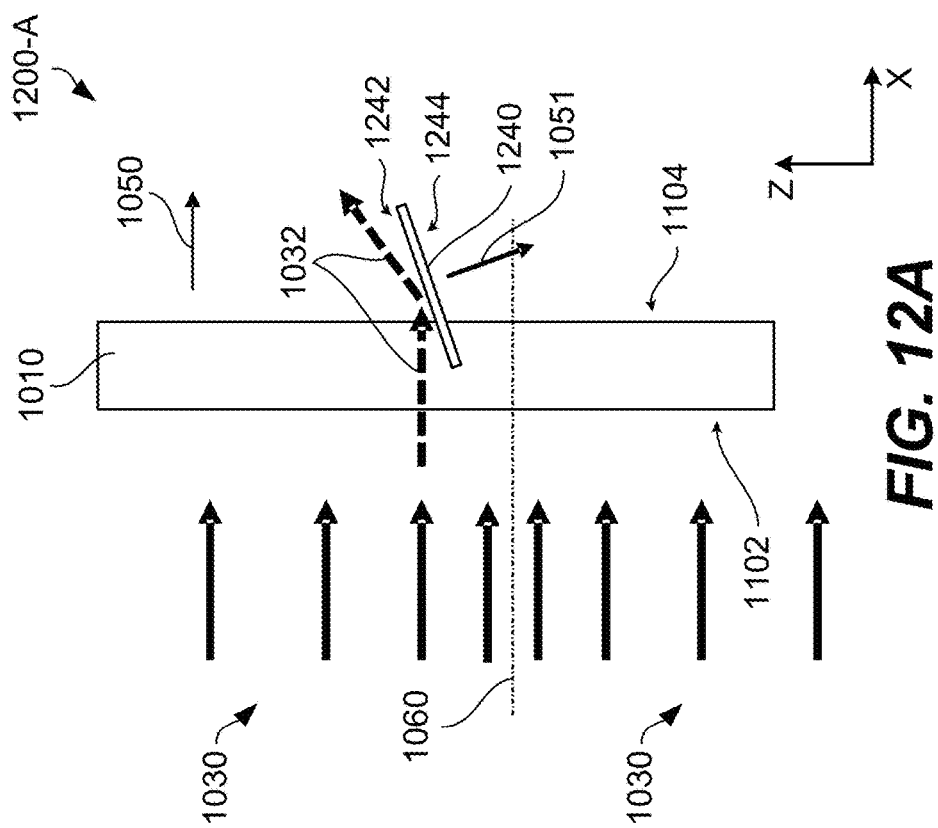
FIGS. 12A, 12B, 12C, and 12D illustrate active rudders on an ion blocker, in accordance with one or more embodiments.

In some embodiments, the vertical stabilizer is configured as an active rudder to pulls the blocker back to the center of the ion beam. FIG. 12A illustrates an ion blocker 1200-A with an active rudder 1240, in accordance with one or more embodiments. In some embodiments, active rudder 1240 includes left side 1242 and right side 1244, and may extend toward the front of ion blocker body 1010. Ion blocker 1200-A may have a similar top-view and side-view configuration and/or profile in the neutral position as vertical stabilizer 1140 on ion blocker 1100, as shown in FIGS. 11A and 11B. FIG. 12A shows a top view of ion blocker 1200 in an off-center position. When ion blocker 1200-A is off-center from the central axis 1060 of the ion beam, the active rudder 1240 may be pivoted toward the direction of off-center travel. As shown in FIG. 12A, ion blocker 1200 has traveled to the left of the central axis 1060 (upwards on the page). In this situation, active rudder 1240 is pivoted towards the left to expose left surface 1242 of rudder 1240 to the ions passing over or under the ion blocker such that ions strike left surface 1242 (shown in dashed arrows 1032). This creates an off-center deflection force 1051 with a lateral component which causes the ion blocker to travel toward the beam central axis 1060.

In some embodiments, an active rudder can create a lateral restoring force before the ion blocker rotates (yaws) due to the unbalanced force. This may provide a quicker response compared to the static vertical stabilizer. The quicker response time may allow the ion blocker to be adjusted more quickly and allow the ion blocker to stay centered for greater periods during operation.

Figure 12C:
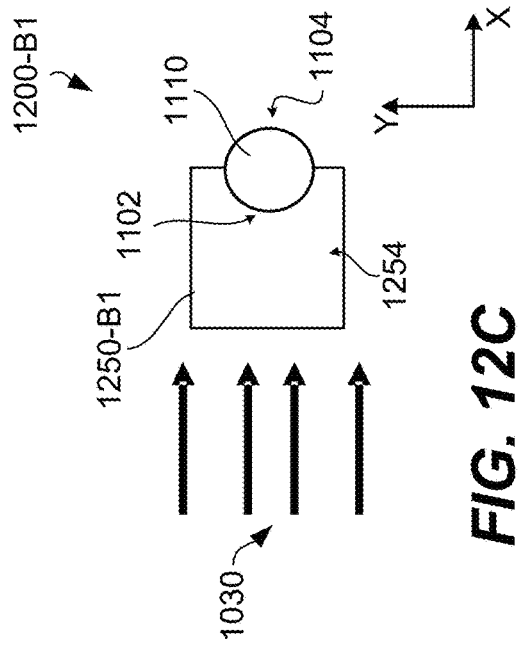
Figure 12D:
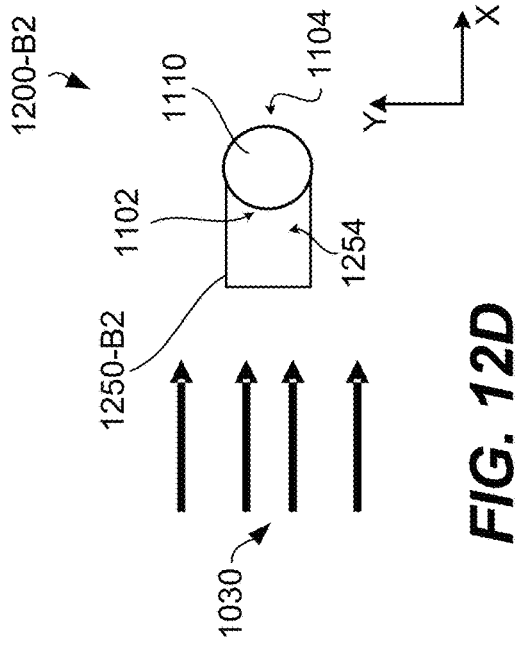
Figure 12B:
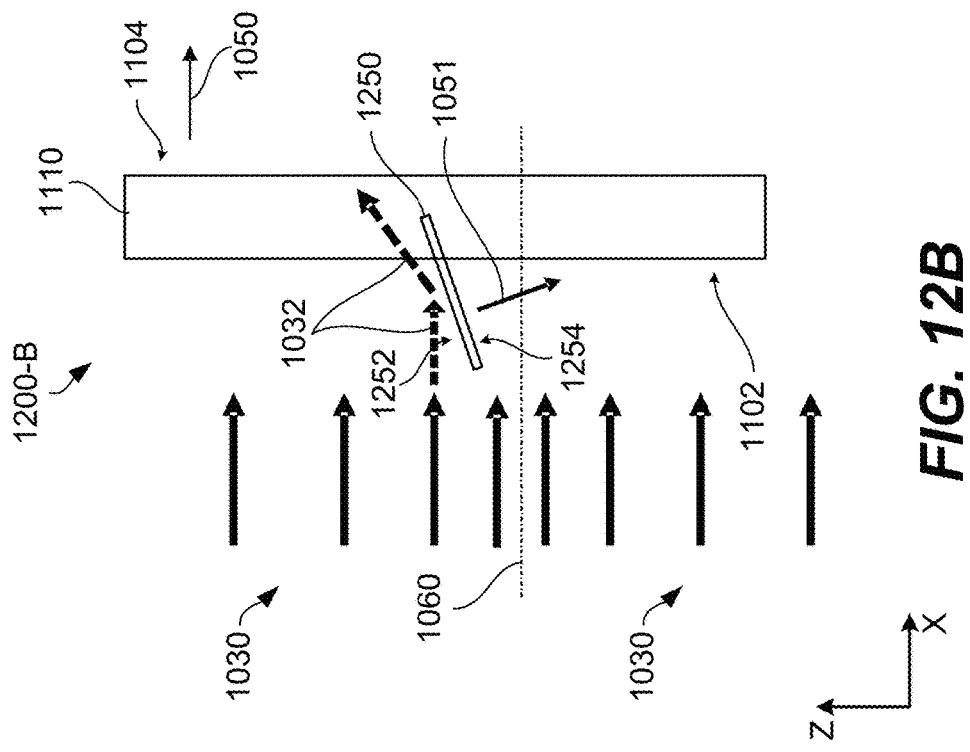

FIGS. 12B, 12C, and 12D illustrate additional ion blocker embodiments with an active rudder that is configured to operate at the rear of the ion blocker, in accordance with one or more embodiments. Active rudder 1250 may extend toward the rear of the ion blocker and may include a left surface 1252 and a right surface 1254. As depicted in 12B, ion blocker 1200-B has moved off-center to the left of central axis 1060 of the ion beam (upwards on the page). In this situation, active rudder 1250, located to the rear of ion blocker 1200-B, may be pivoted toward the right side to expose left surface 1252 of active rudder 1250 to the ion beam. Ions striking left surface 1252 (shown in dashed lines 1032) create a deflection force 1051 with a lateral component to restore the ion blocker toward the central axis 1060 of the ion beam.

FIG. 12C illustrates a side view of ion blocker 1200-B1 with an active rudder 1250-B1. In some embodiments, ion blocker 1200-B1 is ion blocker 1200-B. Similar to vertical stabilizer 1140 and active rudder 1240, active rudder 1250-B1 may extend above and below the ion blocker body 1110. However, an active rudder positioned to the rear of the ion blocker may not need to extend above and below the ion blocker body 1110 because the surface of the ion blocker will not prevent ions from striking the middle portion of the active rudder. As such, an active rudder may be configured with the same or smaller vertical height as the ion blocker.

FIG. 12D illustrates a side view of ion blocker 1200-B2 with an active rudder 1250-B2. In some embodiments, ion blocker 1200-B2 is ion blocker 1200-B. As shown, active rudder 1250-B2 does not extend above and below the ion blocker body 1110. As such, a rear active rudder, such as active rudder 1250-B2, may be able to capture more ions than a forward active rudder, such as active rudder 1240. Thus, a rear active rudder may be smaller, reducing weight and costs. Capturing more ions from the rear may also allow the rear active rudder to provide a faster and greater response to restore ion blocker positioning.

Figure 13B:
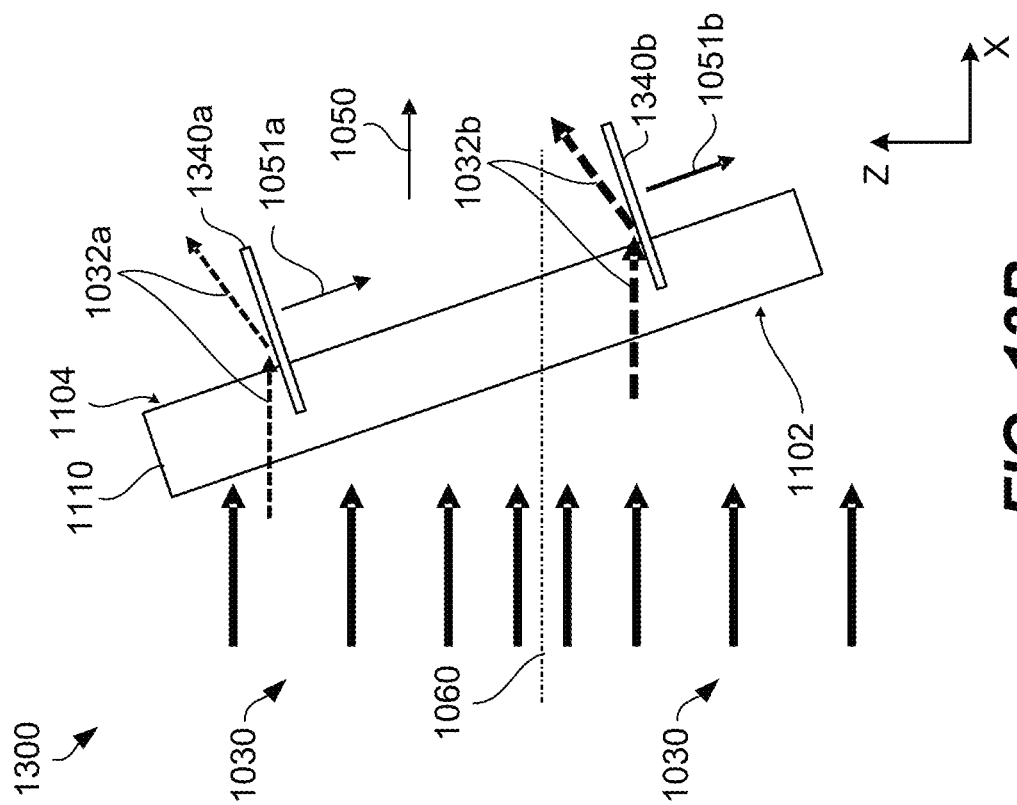
FIGS. 13A and 13B illustrate an ion blocker with tandem vertical stabilizers, in accordance with one or more embodiments.
Figure 13A:
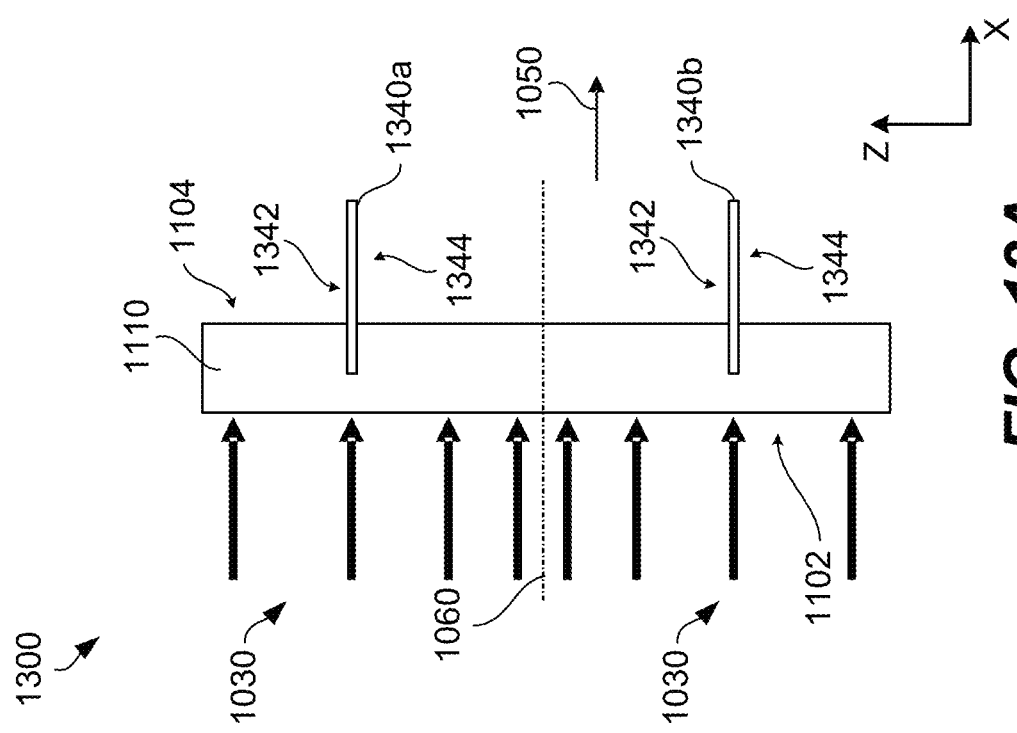

In some embodiments, tandem vertical stabilizers are implemented. FIGS. 13A and 13B illustrate an ion blocker 1300 with tandem vertical stabilizers, in accordance with one or more embodiments. FIG. 13A shows a top view of ion blocker 1300 centered on the ion beam. FIG. 13B shows a top view of ion blocker 1300 in an off-center position. As depicted, ion blocker 1300 comprises vertical stabilizers 1340a and 1340b which are positioned laterally of the central axis 1060. In various embodiments, vertical stabilizers 1340a and 1340b are positioned at the same distance from the center of the ion blocker body 1110. Similar to vertical stabilizer 1140, the tandem vertical stabilizers may be configured to extend toward the front of the ion blocker body 1110, and may extend above and below the ion blocker body 1110, resulting in a similar side-view profile as that shown in FIG. 11B. Each vertical stabilizer may comprise a left surface 1342 and right surface 1344.

With this configuration, as the ion blocker begins to yaw off-center (shown in FIG. 13B), one of the vertical stabilizers (1340b) moves toward the peak of the center of the ion beam near the central axis 1060. The yaw rotation of the ion blocker also exposes a surface of both vertical stabilizers to ions passing above and below the ion blocker body 1110. In FIG. 13B, the left side 1342 of each vertical stabilizer are turned toward the ion beam. Ions striking the respective left surfaces (shown in dashed lines 1032a and 1032b) create a deflection force 1051a and 1051b on vertical stabilizers 1340a and 1340b, respectively. The deflection forces 1051a and 1051b each include a lateral component to restore the ion blocker toward the central axis 1060 of the ion beam.

Because the right vertical stabilizer 1340b has moved toward the central axis 1060 with greater density of ions, more ions strike vertical stabilizer 1340b at 1032b relative to ions striking vertical stabilizer 1340a and 1032a. This causes a greater net deflection force 1051b relative to deflection force 1051a, which yaws the ion blocker toward the neutral position. Additionally, deflection force 1051b increases as the ion blocker moves farther off-center, which provides more lateral stability than a single vertical stabilizer.

In some embodiments, tandem vertical stabilizers may be implemented as dual active rudders. As described with reference to FIGS. 12A-12D, dual active rudders may be positioned at the rear or to the front of the ion blocker body. Dual active rudders may provide increased control of ion blocker positioning by allowing a restoring force to be created before the ion blocker rotates due to unbalanced forces. In some embodiments, each of the dual active rudders may be independently controlled for increased control and response.

Although the previous examples have been described with reference to lateral movement and yawing rotation of the ion blocker toward the left, it should be understood that lateral movement or yawing rotation toward the right may be similarly addressed by similar opposing structures, operations, and methods. In various embodiments, one or more components and/or configurations described above may be implemented in combination to stabilize the ion blocker. For example, active rudders may be implemented with an ion blocker comprising a swept rear contact surface. As another example, an ion blocker may comprise a central vertical stabilizer with tandem active rudders located laterally. In various embodiments, vertical stabilizers and/or active rudders may be metallized or made conductive with similar materials as the surface of the ion blocker, as further described below.

Ion Blocker Configurations

In various embodiments, the ion blocker may be configured for various operational considerations. As previously described, the ion blocker may include a metallized, or otherwise conductive, surface to increase the possible electric potential of a larger portion of the surface and stop an ion approaching the surface perpendicularly. For example, the surface of the ion blocker may comprise graphene, organic conductors, or spray on coatings of semiconductor material with a dopant such as silicone. Without a conductive surface, only portions of the surface that are perpendicular to the incoming ion beam would reach the highest potential, and other portions on the surface may only reach a sufficient electric potential to stop ions from hitting that portion. As such, ions traveling toward the edges of the ion blocker are deflected through smaller angles and transfer less momentum to the blocker. In contrast, a conductive surface would increase the electric potential throughout the entire surface and increase deflection of ions passing near ion blocker and increase transferred momentum.

During operation, bombardment of the ion blocker by impacting ions may erode the material of the ion blocker. As such, the surface of the ion blocker may be constructed with an appropriate thickness and/or material of appropriate durability to survive the predicted fluence of ions at each location of the ion blocker. For example, the ion blocker may be configured to be thicker at the center than at the edges because a higher proportion of ions are expected to strike the center. Such prediction may also consider the reduced fluence of ions due to complete deflection by the ion blocker with a fully charged surface.

The ion blocker may further be configured with different geometric configurations. For example, the ion blocker may be implemented as a spherical or ellipsoidal structure such that the curved surface may encourage yaw stability of in the ion beam, as previously explained. In some embodiments, the ion blocker may be implemented as an elongated cylindrical or toroidal structure for increased capture of ions based on the pattern of the ion beam spread. In some embodiments, the ion blocker may comprise a slightly swept profile to improve yaw stability and positioning of the ion blocker relative to the ion beam.

As previously described, the ion blocker may comprise an aerodynamic shape. For example, an ion blocker may include a tail, or a slightly swept-wing shape (e.g., a DC-3 airplane) to maintain yaw stability and keep the ion blocker centered along the ion beam. In some embodiments, the ion blocker may be implemented as a balloon structure, which may be more suitable for deployment and configuration of particular geometries. A balloon structure is also a lightweight structure that satisfies weight requirements and space limitations during launch of the spacecraft. In one particular example embodiment, the ion blocker may comprise an elongated cylindrical balloon to match the elongated pattern of the ion beam spread, and further be positioned in a slightly swept shape that is supported by a cord or wire.

In some embodiments, the ion blocker is a single sheet, or sail, which is unfolded as it is deployed. In some embodiments, the ion blocker may be held in shape by one or more inflated cylinders or trusses. The sheet may include a slightly swept shape for yaw stability. A single sheet of material may be lighter in weight and lower cost than a balloon structure requiring additional material to confine gas within the structure.

In some embodiments, the ion blocker may comprise an open grid or open fabric structure. For example, the ion blocker may comprise a metallized polyethylene mesh with relatively large gaps between strands of polyethylene. Such configuration would provide a large effective cross-section with a relatively small physical surface area of material, thereby reducing required material, weight, and overall cost. The conductive surface builds charge as ions strike the ion blocker. Near the surface, the resulting electric field would be the same as if the mesh sheet were an infinite plane. As the electric potential of the ion blocker becomes as high as the accelerating voltage in the thruster, impacting ions are deflected and stop physically impacting the ion blocker. The electric field causes the ions to turn around before the ions hit the polyethylene strands and before the ions reach the gaps between the strands. Effectively, such ion blocker would repel all or substantially all of the approaching ions with a lower physical area and overall mass, than an ion blocker made of continuous material. For example, such an ion blocker may be approximately ten times lighter than a non-porous sheet of the same cross-section. Such an ion blocker may also have approximately ten times less aerodynamic drag because neutral molecules that are not repelled by the electric field are allowed to pass through the gaps rather than impacting the ion blocker.

In some embodiments, the ion blocker may comprise a magnetic field generator. Such ion blocker would generate a magnetic field, such as with one or more simple dipoles or with an ion-inflated magnetic field as in the mini-magnetospheric plasma propulsion (M2P2) scheme. Approaching ions from the ion thruster are deflected from the magnetic region and transfer the momentum to the ion blocker.

Thrust Diagonal to Magnetic Field Lines

Figure 14A:
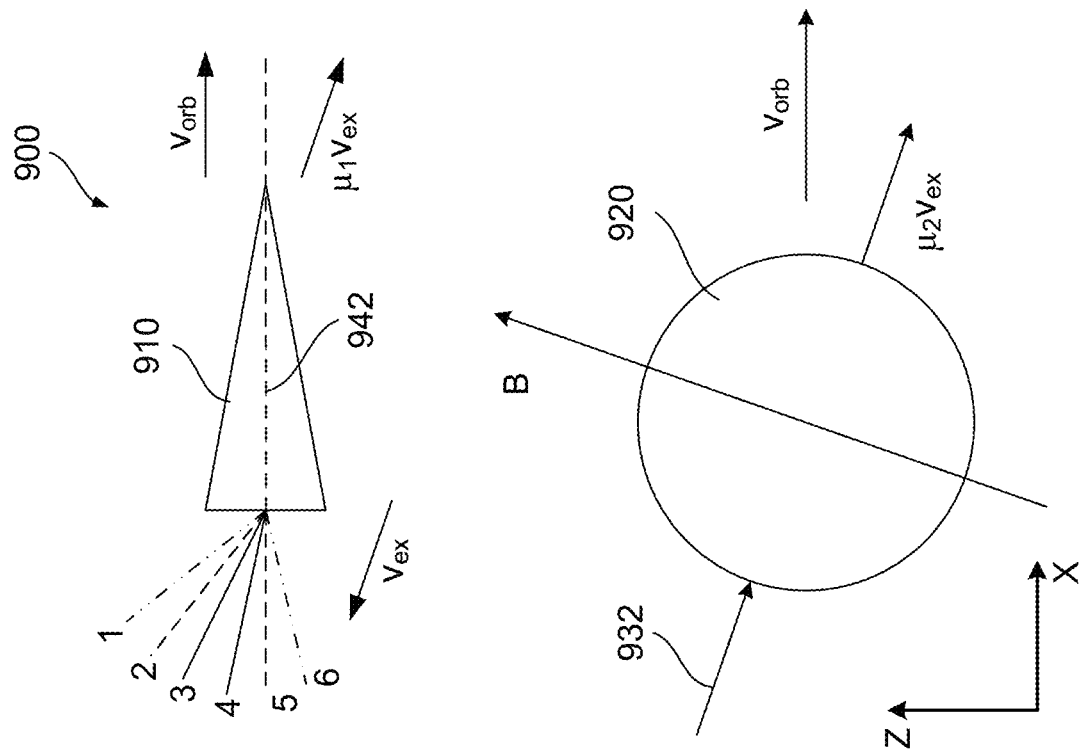
FIGS. 14A and 14B illustrate schematic views of non-perpendicular spacecraft movement relative to a magnetic field, in accordance with one or more embodiments.
Figure 14B:
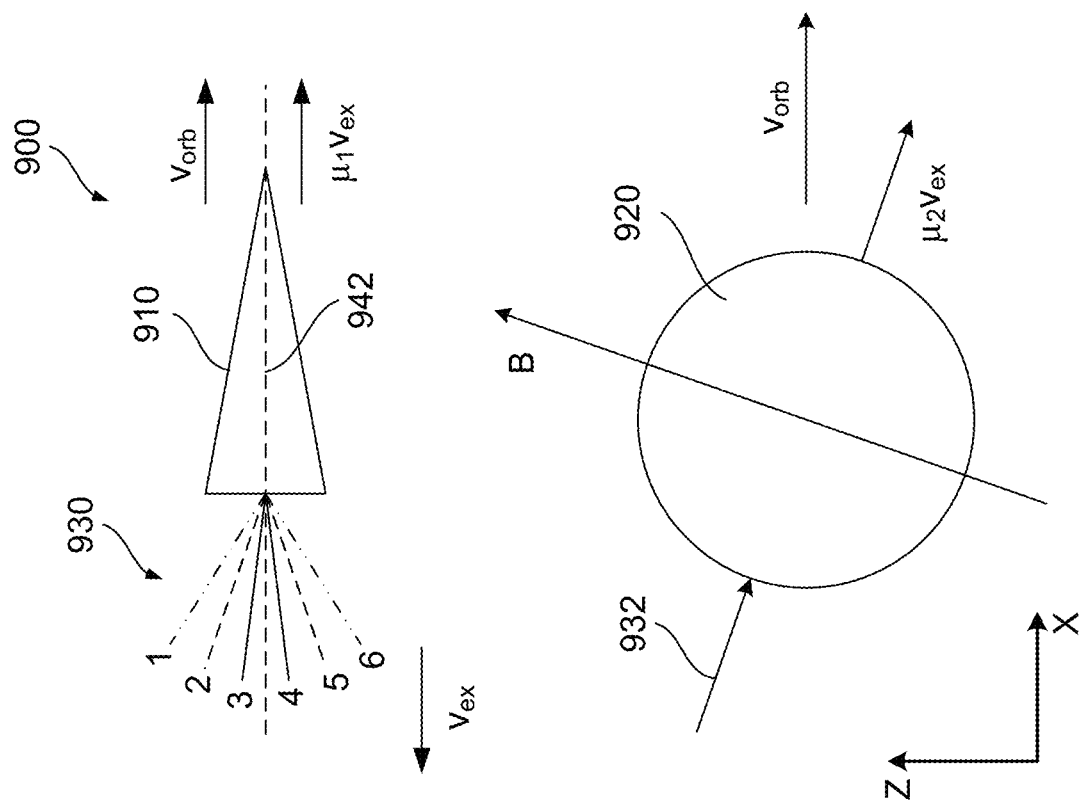

The examples and explanations above describe cases in which the spacecraft and the emitted ions move perpendicularly to the magnetic field B. However, the described systems and methods may continue to increase total thrust even when the velocity vector $v_{orb}$ is not perpendicular to the magnetic field B. FIGS. 14A and 14B illustrate schematic views of non-perpendicular spacecraft movement relative to a magnetic field, in accordance with one or more embodiments. As depicted, the desired velocity vector $v_{orb}$ of the spacecraft is parallel to the X-axis, but not perpendicular to magnetic field B.

The lines 1, 2, 3, 4, 5, and 6 represent streams of ions in ion beam 930 emitted by the ion thruster in the direction of vector $v_{ex}$. Lines 3 and 4 are nearest the center of the ion plume and indicate a higher density of ions in the stream. Lines 2 and 5, in dashed lines, are further from the center and indicate a lower density of ions in the stream. Lines 1 and 6, shown in dashed-dotted lines, are the farthest from the center and indicate the lowest density of ions in the stream.

In FIG. 14A, the $v_{ex}$ of ion beam 930 generates thrust equal to $\mu_1 v_{ex}$ in the direction of $v_{orb}$. However, the $v_{ex}$ of ion beam 930 is not perpendicular to magnetic field B. If ion beam 930 were perpendicular to magnetic field B, then ions from the center of the plume (between lines 3 and 4) representing the highest concentration of ions would hit the ion blocker. Instead, only ions between lines 1 and 2 that diverge to a perpendicular direction to magnetic field B will have trajectory 932 that impacts the ion blocker.

Since the ion density between lines 1 and 2 is less than that of ions between lines 3 and 4, less thrust $\mu_2 v_{ex}$ is generated at the ion blocker in this situation. Additionally, the thrust generated at ion blocker is not aligned with the desired orbital motion $v_{orb}$ or with the desired acceleration. This misalignment may roughly average out over an orbit, and almost completely averages out over one day (i.e., one rotation of the planet, which shifts the magnetic field orientation through one full cycle), but such losses may be accounted for. Additionally, when the thrust at the ion blocker is not aligned with the desired orbital direction, the thrust must satisfy constraints for lateral stability in the tether as well as longitudinal stability.

As previously discussed, the ion thruster may be gimballed to direct the $v_{ex}$ of the ion beam laterally to provide lateral stability of the ion blocker. This same mechanism can be implemented to maintain or increase thrust when the velocity vector $v_{orb}$ of the spacecraft is not perpendicular to magnetic field B. As shown in FIG. 14B, the ion thruster may be aimed laterally such that a higher density of ions in the beam (between lines 3 and 4) are emitted in the direction of velocity $v_{ex}$ perpendicular to magnetic field B. This generates thrust $\mu_1 v_{ex}$ in a direction perpendicular to the magnetic field.

Since ion density is higher between lines 3 and 4 than at line 1, a higher density of ions approach the ion blocker at trajectory 932, and the resulting force on the ion blocker is higher. Although thrust at the spacecraft ($m_1 v_{ex}$) may be slightly off the desired direction of acceleration, more thrust ($\mu_2 v_{ex}$) is generated at the ion blocker, and the net component in the desired direction $v_{orb}$ is greater, and over an orbit or a day the off-vector thrust averages out. To aim the ion thruster, the ion thruster may be gimballed with respect to the spacecraft, or the spacecraft may be yawed, typically by using a control moment gyro.

Thruster/Propellant Embodiments

In various embodiments, a variety of propellants may be used by the ion thruster. In some embodiments, the described propulsion systems may use ions with lower atomic mass, such as lithium, neon, or argon, which are not ions typically used for propulsion (such as cesium, krypton, or xenon). The use of lower atomic mass ions can shorten the gyroradius, which reduces the necessary size and weight of the ion blocker.

Figure 15A:
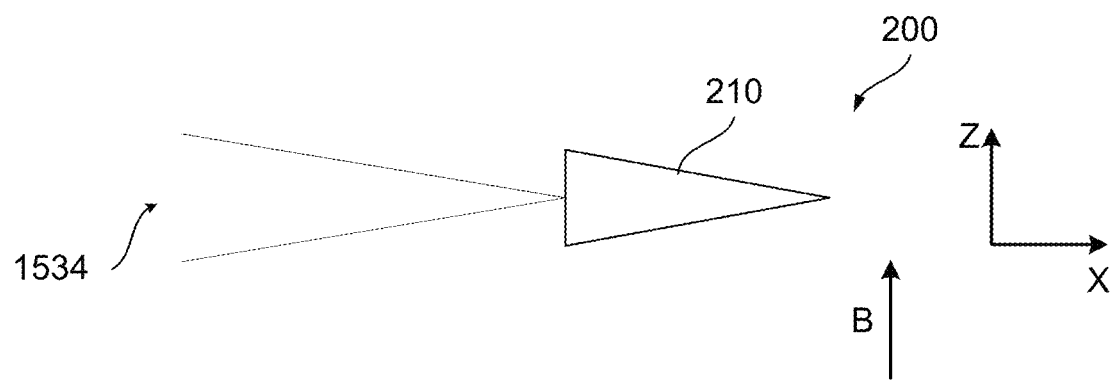
FIGS. 15A, 15B, and 15C illustrate schematic views of modified ion plumes, in accordance with one or more embodiments.
Figure 15B:
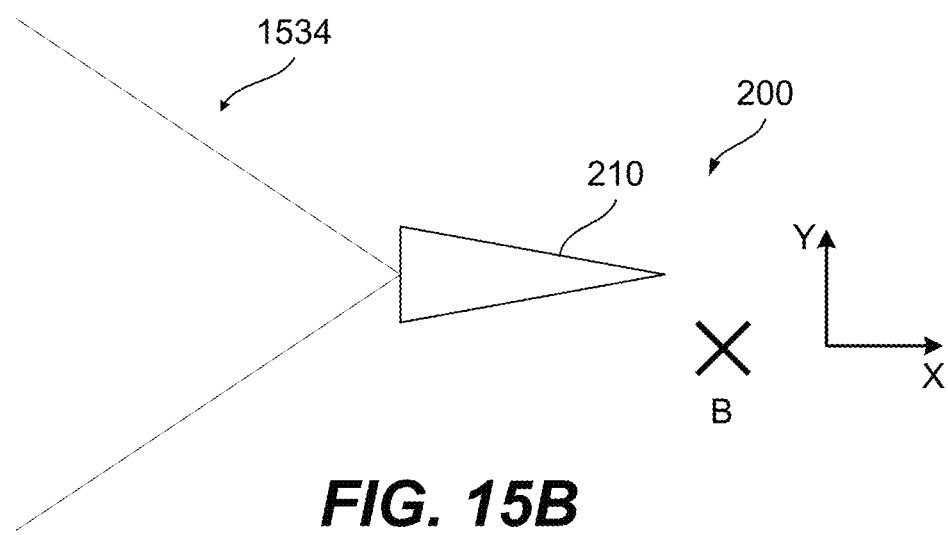
Figure 15C:
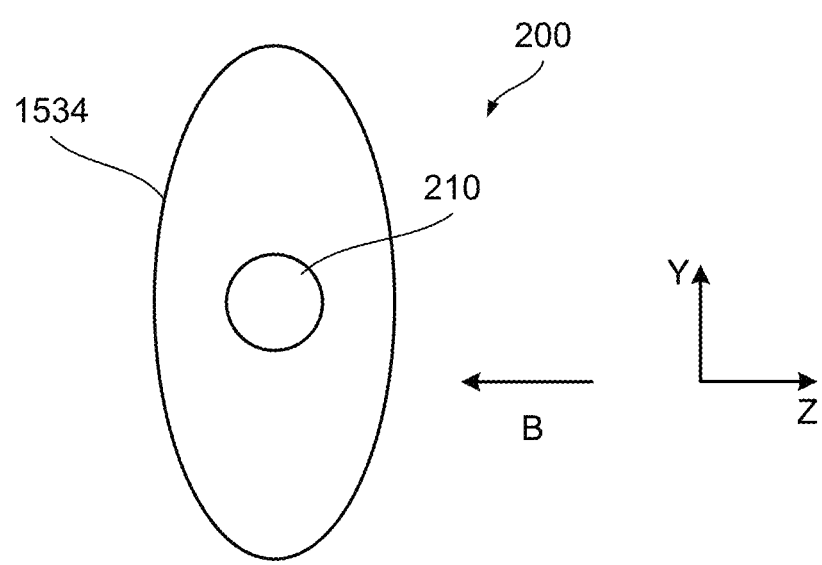

FIGS. 15A, 15B, and 15C illustrate schematic views of a modified plume of an ion beam, in accordance with one or more embodiments. In some embodiments, the ion thruster of the propulsion system may comprise a non-circular beam spread. For example, the emitted beam may be wider vertically (along the Y-axis) than horizontally (along the Z-axis). FIG. 15A shows a top view of body 210 of spacecraft 200 with an ion thruster emitting modified ion beam 1534, FIG. 15B shows a side view of body 210 of spacecraft 200 with an ion thruster emitting such modified ion beam 1534, and FIG. 15C shows a front view of body 210 of spacecraft 200 with an ion thruster emitting modified ion beam 1534. In various embodiments a modified ion beam, such as ion beam 1534, includes a narrower horizontal spread (larger vertical spread) in order to reduce the resulting horizontal spread as the ions travel along the gyroradius of circular trajectory.

Adjusting to Changes in Magnetic Field Vectors

As the spacecraft travels in LEO, such as increasing or decreasing altitude with respect to the planet, or such as changing direction with respect to the magnetic field, the effect of the magnetic field on the emitted ions changes. Several maneuvering operations may be implemented to maintain or improve thrust at the ion blocker. One such operation may comprise changing the length of the tethers to appropriately position the ion blocker based on the changing gyroradius of the ion beam trajectory. The exhaust velocity may also be adjusted to achieve a desired gyroradius based on the magnetic field strength or direction of the magnetic field vector.

The ejection angle of the ion beam may also be adjusted in elevation or in azimuth, as previously described, in accordance with the changing magnetic field vector direction. In some embodiments, ion ejection may be stopped during times when the thrust would be too far off-axis. As shown in FIGS. 14A and 14B, thrust may differ from the orbital velocity vector by a substantial angle. For orbit maintenance or orbit raising, the effective Isp, i.e., the impulse in the desired direction per kilogram of propellant expended, is proportional to the cosine of the angle between thrust and velocity vector. For some applications, during times when this angle is large to accommodate the direction of the magnetic field vector, it may be necessary to cease ion ejection to ensure propellant is used efficiently enough to provide thrust through the end of the mission.

In some embodiments, the described propulsion system is configured to operate in a high-inclination orbit to enable travel roughly parallel to the magnetic field vector (i.e., along the Z-axis). Here, the ion thruster may emit ions horizontally and roughly perpendicular to the direction of travel (i.e., sideways along the X-axis). The magnetic field causes the emitted ions to gyrate and strike the ion blocker to produce a thrust that is sideways relative to the spacecraft motion. This would provide high specific impulse for changing the orbital plane, which may be of special value, such as to various Earth observation satellites. Such operation would also not lose any of the $2v_{orb}$ from the ion speed, unlike in-plane thrust shown in FIGS. 7A and 7B.

Instead of ejecting the ions backward relative to $v_{orb}$ so they have relative velocity $v_{rel}=v_{ex}-v_{orb}$ perpendicular to the magnetic field lines and impact speed at the ion blocker of $v_2=v_{ex}-2v_{orb}$, the ions are ejected perpendicular to $v_{orb}$. Their speed perpendicular to the magnetic field lines is simply $v_{ex}$ and their speed parallel to the magnetic field lines is $v_{orb}$. The ions thus spiral along the field lines and strike the blocker at the same relative speed with which they leave the ion engine: $v_{ex}$.

In some embodiments, the system may rotate much faster than once per orbit when operating in high-inclination orbit. Thus tension in the tether may be maintained by centripetal force between the spacecraft and the ion blocker rather than by the gravity gradient. The system may rotate in a plane that is roughly horizontal over the North and South magnetic poles, where the magnetic field is roughly vertical (along the Y-axis). When the propulsion system passes near the magnetic poles, ions emitted from the ion thruster gyrate in a roughly horizontal path and approach the ion blocker. During such maneuvers, the ion thruster may emit ions only during parts of the rotation where the thrust vector is pointed in the desired direction. This operational maneuver may be used to raise or lower the orbit, or change the orbital plane, depending on which position in the rotation it is in.

Method of Operation

Figure 16:
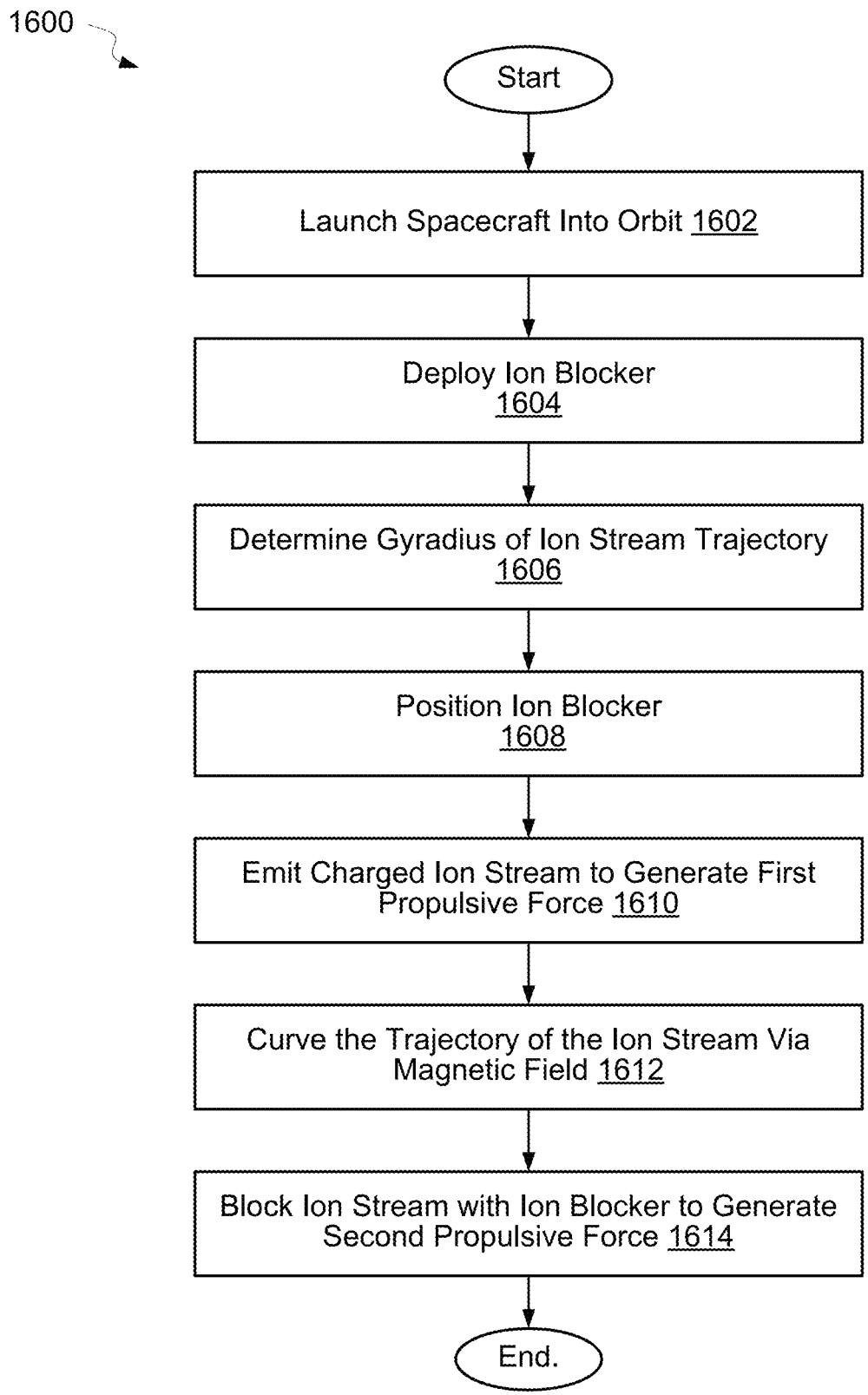
FIG. 16 illustrates a method for operating an ion propelled spacecraft with a tethered ion blocker, in accordance with one or more embodiments.

Also provided are methods of operating the described propulsion systems. With reference to FIG. 16, shown is an example process 1600 for operating a propulsion system, in accordance with an illustrative embodiment. In various embodiments, the propulsion system may be implemented to maneuver a spacecraft in LEO.

At 1602, a spacecraft is launched into orbit. In some embodiments, the spacecraft may travel via a launch vehicle. In some embodiments, at least part of the orbital path is roughly perpendicular to the planet's magnetic field. At 1604, the ion blocker is deployed from the spacecraft. As previously described, the ion blocker may be a deflated balloon or sheet that is folded and stored on or within the spacecraft. Once the spacecraft has reached a predetermined orbital position, such as in LEO, the ion blocker may be deployed via tethers on a reel system such that the ion blocker is suspended from the spacecraft via one or more electrically insulated tethers.

An ion blocker is then expanded to provide a large cross-sectional area. For example, an ion blocker with a balloon structure may be inflated, or otherwise expanded via support structures. As another example, an ion blocker comprising a single sheet or sail may be expanded by inflatable support structures.

At 1606, the gyroradius of the trajectory of the ion beam is determined. The gyroradius may be determined based on the direction of the magnetic field and the strength of the magnetic field. In some embodiments, the direction of the magnetic field and the strength of the magnetic field are determined via sensors, such as a magnetometer, gaussmeter, or other suitable sensor. Multiple sensors may be used to determine the strength of the magnetic field. In some embodiments, the direction and strength of the magnetic field are determined based on the altitude and location of the spacecraft relative to the planet. In some embodiments, the direction and strength of the magnetic field are determined by receiving the relevant data, such as from a space station or other satellite.

The gyroradius of the trajectory of the ion beam may then be determined based on the exhaust velocity of the ion beam and the determined strength and direction of the magnetic field. In some embodiments, the gyroradius is determined based on the planned or desired exhaust velocity prior to operation of the ion propulsion system.

At 1608, the ion blocker is positioned based on the determined gyroradius of the trajectory of the ion beam. In various embodiments, the ion blocker is positioned by adjusting the length of each tether using the reel system. In some embodiments, each tether may be independently adjusted for increased positional control of the ion blocker. In various embodiments, the ion blocker is positioned approximately twice the distance of the gyroradius from the spacecraft in order to intercept the ions in the curved trajectory. However, the desired position of the ion blocker may depend on various other factors previously described. The length of each of the one or more electrically insulated tethers may be adjusted based on the computed gyroradius or desired position of the ion blocker. In some embodiments, operations 1606 and 1608 may be performed as part of operation 1604 to deploy the ion blocker.

At 1610, a charged ion beam is emitted to generate a first propulsive force. The ion beam may be emitted from the ion propulsion system of the spacecraft. In some embodiments, the charged ion beam comprises a collimated beam of ions with a uniform speed. For example, an ion thruster may be configured to emit argon ions at an exhaust velocity of approximately 20 km/sec. In some embodiments the ion beam is emitted in a direction with an ion velocity vector that includes an ion vector component that is perpendicular to a magnetic field of a planet, such as Earth. The emitted ion beam generates the first propulsive force on the spacecraft in an opposite direction to the ion velocity vector.

Electrons may also ejected by the ion propulsion system to keep the spacecraft electrically neutral. In some embodiments, electrons are emitted along an electron velocity vector that minimizes mixing of emitted electrons with emitted ions. For example, electrons may be ejected with substantial velocity, in a direction that is perpendicular, or substantially perpendicular, to the ion beam.

At 1612, the trajectory of the ion beam is curved via the magnetic field. The trajectory of the ion beam is curved by the magnetic force $F_{ion}$ on each ion that is the cross product of the magnetic field and the ion's velocity.

At 1614, the ions in the ion beam are blocked by the ion blocker to generate a second propulsive force. In some embodiments, the ion blocker blocks ion within the ion beam by contacting the ions or deflecting the ions to generate the second propulsive force on the ion blocker. Ions that strike the ion blocker may stick to the ion blocker and deliver momentum. Each ion that contacts the ion blocker transfer momentum equal to the product of the mass of the ion and the velocity of the ion. Once sufficient electric potential has built up on the surface of the ion blocker, ions may be deflected before striking the ion blocker. Such deflected ions will also transfer momentum to the ion blocker. Ions that are deflected in the opposite direction may deliver twice the momentum as impacting ions.

In some embodiments, the ion blocker may be further positioned (1608) during operation. In some embodiments, the positioning of the ion blocker may be further modified based on various factors previously described. For example, the movement of the spacecraft and/or the transferred momentum of the ions may move the ion blocker to a more forward position. As such, the ion blocker may be moved closer to the spacecraft via the reel system in order to increase the amount of captured ions. In some embodiments, the position of the ion blocker may be changed based on modified ion beams or different surface geometries of the ion blocker.

In some embodiments, the ion beam may be directed downward relative to a longitudinal axis of the spacecraft to compensate for the forward motion of the spacecraft and/or ion blocker. In some embodiments, the ion beam is adjusted laterally to increase a velocity vector of the spacecraft that is greater than or less than 90 degrees with respect to the magnetic field.

In some embodiments, two ion beams are emitted. The two ion beams may diverge laterally such that a peak flux of each ion beam contacts respective lateral sides of the ion blocker to produce respective lateral forces that urge the ion blocker to a center position.

Spacecraft Examples

Figure 17:
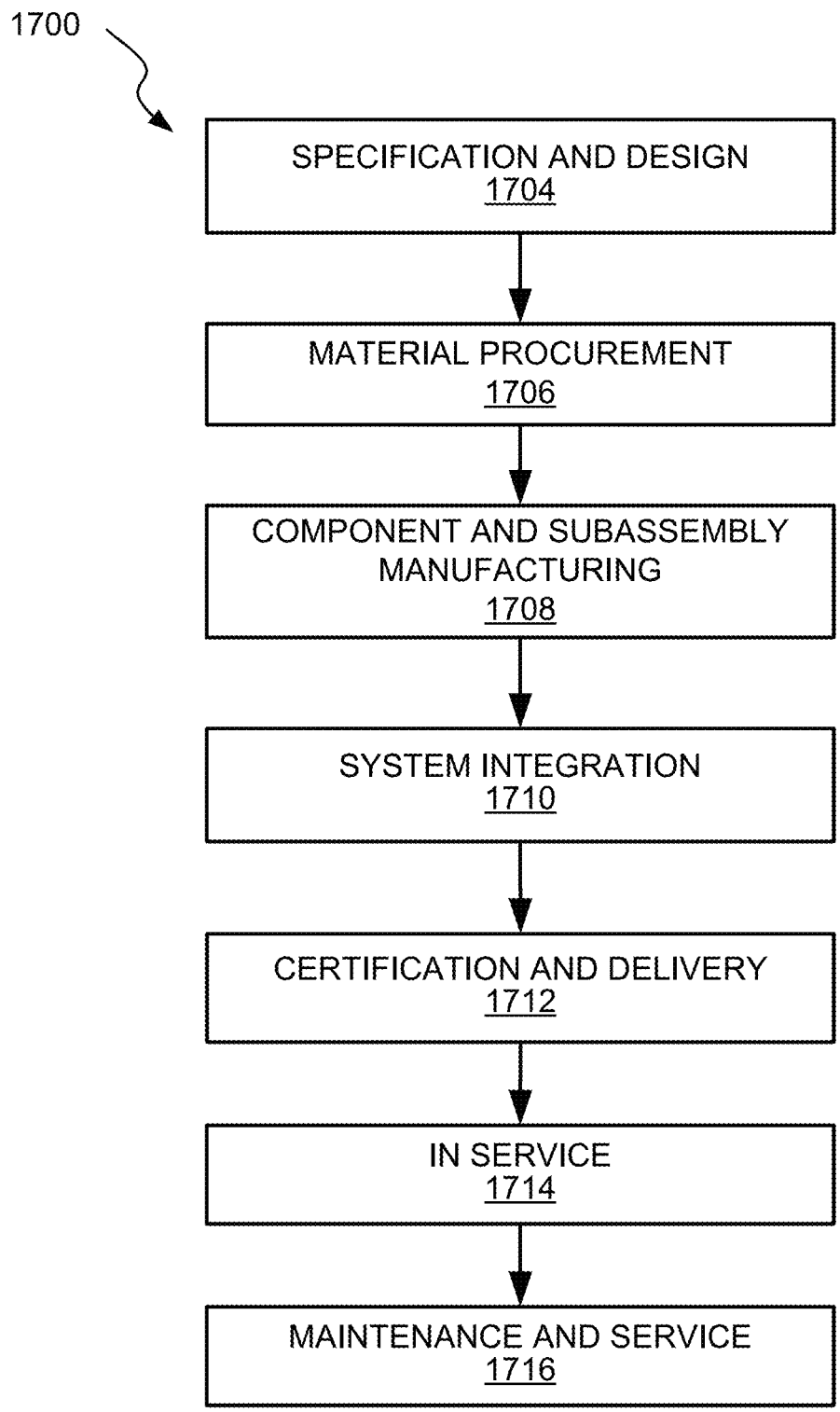
FIG. 17 is a block diagram of spacecraft production and service methodology that may utilize methods and assemblies described herein.

Examples of the present disclosure may be described in the context of spacecraft 200 as shown in FIG. 2 and spacecraft manufacturing and service method 800 as shown in FIG. 17. As previously described, FIG. 2 is a schematic illustration of spacecraft 200 which may comprise various propulsion systems as described herein. Although an aerospace example is shown, the principles disclosed herein may be applied to other industries.

FIG. 17 is a block diagram of aircraft production and service methodology that may utilize methods and assemblies described herein. During pre-production, illustrative method 1700 may include specification and design (block 1704) of spacecraft 200 and material procurement (block 1706). During production, component and subassembly manufacturing (block 1708) and inspection system integration (block 1710) of spacecraft 200 may take place. Described apparatus, and corresponding methods of operation and manufacture, may be implemented in any of specification and design (block 1704) of spacecraft 200, material procurement (block 1706), component and subassembly manufacturing (block 1708), and/or inspection system integration (block 1710) of spacecraft 200.

Thereafter, spacecraft 200 may go through certification and delivery (block 1712) to be placed in service (block 1714). While in service, spacecraft 200 may be scheduled for routine maintenance and service (block 1716). Routine maintenance and service may include modification, reconfiguration, refurbishment, etc. of one or more inspection systems of spacecraft 200. Described apparatus, and corresponding methods of operation and manufacture, may be implemented in any of certification and delivery (block 1712), service (block 1714), and/or routine maintenance and service (block 1716).

Each of the processes of illustrative method 1700 may be performed or carried out by an inspection system integrator, a third party, and/or an operator (e.g., a customer). For the purposes of this description, an inspection system integrator may include, without limitation, any number of aircraft manufacturers and major-inspection system subcontractors; a third party may include, without limitation, any number of vendors, subcontractors, and suppliers; and an operator may be an airline, leasing company, military entity, service organization, and so on.

CONCLUSION

In the above description, numerous specific details are set forth to provide a thorough understanding of the disclosed concepts, which may be practiced without some or all of these particulars. In other instances, details of known devices and/or processes have been omitted to avoid unnecessarily obscuring the disclosure.

While the present disclosure has been particularly shown and described with reference to specific embodiments thereof, it will be understood by those skilled in the art that changes in the form and details of the disclosed embodiments may be made without departing from the spirit or scope of the present disclosure. The description of the different illustrative embodiments has been presented for purposes of illustration and description, and is not intended to be exhaustive or limited to the embodiments in the form disclosed. Many modifications and variations will be apparent to those of ordinary skill in the art. It is therefore intended that the present disclosure be interpreted to include all variations and equivalents that fall within the true spirit and scope of the present disclosure. Accordingly, the present examples are to be considered as illustrative and not restrictive.

Although many of the components and processes are described above in the singular for convenience, it will be appreciated by one of skill in the art that multiple components and repeated processes can also be used to practice the techniques of the present disclosure.

What is claimed is:

1. A spacecraft (200) comprising:
   an ion propulsion system (205);
   one or more tethers (512) coupled to the spacecraft at a first end of each of the one or more tethers (212), wherein the one or more tethers are electrically insulated; and
   an ion blocker (220) coupled to a second end of each of the one or more tethers;
   wherein the ion propulsion system is configured to generate a first propulsive force by emitting a charged ion beam at a trajectory such that ions within the ion beam are blocked by the ion blocker to generate a second propulsive force on the ion blocker; and
   wherein the tether provides a mechanical connection between the spacecraft and ion blocker that enables the transfer of momentum between the spacecraft and ion blocker.

2. The spacecraft of claim 1, wherein the ion propulsion system is configured to generate the first propulsive force by emitting a charged ion beam in a direction with an ion velocity vector comprising an ion vector component that is perpendicular to a magnetic field of a planet, wherein the magnetic field causes the ion beam to curve toward the ion blocker at a trajectory such that ions within the ion beam are blocked by the ion blocker to generate the second propulsive force on the ion blocker.

3. The spacecraft of claim 2, wherein the ion blocker blocks ions within the ion beam by contacting the ions or deflecting the ions to generate the second propulsive force on the ion blocker.

4. The spacecraft of claim 2, wherein the ion blocker (420) comprises an elongated structure with a horizontal width that is greater than a vertical height.

5. The spacecraft of claim 2, wherein the ion blocker is positioned at about twice a gyroradius of the trajectory of the ion beam.

6. The spacecraft of claim 2, wherein a surface of the ion blocker is configured to accumulate an electrical charge from ions contacting the ion blocker such that at least a portion of subsequent ions are deflected before contacting the surface of the ion blocker.

7. The spacecraft of claim 2, wherein a length of each of the one or more tethers are adjusted based on a computed gyroradius of the trajectory of the ion beam.

8. The spacecraft of claim 7, wherein the gyroradius of the trajectory of the ion beam is computed based on a direction of the magnetic field and a strength of the magnetic field.

9. The spacecraft of claim 2, wherein the one or more tethers comprise an optical fiber configured to transfer power or data from the ion blocker to the spacecraft.

10. The spacecraft of claim 2, wherein the ion propulsion system is configured to emit electrons along an electron velocity vector that minimizes mixing of emitted electrons with emitted ions.

11. The spacecraft of claim 1, wherein the ion blocker further comprises a vertical stabilizer extending toward a front side of the ion blocker.

12. A propulsion system comprising:
    an ion blocker (220);
    one or more tethers (212), wherein the one or more tethers are electrically insulated, wherein a first end of each of the one or more tethers is coupled to a spacecraft (200), and wherein a second end of each of the one or more tethers is coupled to the ion blocker, wherein the tether provides a mechanical connection between the spacecraft and ion blocker that enables the transfer of momentum between the spacecraft and ion blocker; and an ion thruster (205) configured to generate a first propulsive force (Ti) by emitting a charged ion beam (230) in a direction with an ion velocity vector comprising an ion vector component that is perpendicular to a magnetic field of a planet;

wherein the magnetic field causes the ion beam to curve toward the ion blocker at a trajectory (232) such that ions within the ion beam are blocked by the ion blocker to generate a second propulsive force (T2) on the ion blocker.

13. The propulsion system of claim 12, wherein the ion blocker is positioned at about twice a gyroradius of the trajectory of the ion beam, and wherein the ion blocker blocks ions within the ion beam by contacting the ions or deflecting the ions.

14. The propulsion system of claim 12, wherein the ion blocker comprises an elongated structure with a horizontal width that is greater than a vertical height.

15. A method (1600) comprising:

emitting (1610) a charged ion beam from an ion propulsion system (205) of a spacecraft (200), wherein the ion beam is emitted in a direction with an ion velocity vector comprising an ion vector component that is perpendicular to a magnetic field of a planet, wherein the emitted ion beam generates a first propulsive force ($T_1$), wherein a trajectory (232) of the ion beam is curved (1612) via the magnetic field; and blocking (1614) the ion beam with an ion blocker (220) to generate a second propulsive force ($T_2$) on the ion blocker, wherein the ion blocker is suspended from the spacecraft via one or more electrically insulated tethers (212).

16. The method of claim 15, wherein the ion blocker blocks ions within the ion beam by contacting the ions or deflecting the ions to generate a second propulsive force on the ion blocker.

17. The method of claim 15, further comprising:

determining (1606) a gyroradius of the trajectory of the ion beam based on a direction of the magnetic field and a strength of the magnetic field, positioning (1608) the ion blocker based on the determined gyroradius.

18. The method of claim 17, wherein a center of the ion blocker is positioned at approximately twice the determined gyroradius of the trajectory.

19. The method of claim of 17, wherein the direction of the magnetic field and the strength of the magnetic field are determined by:

measuring the magnetic field, or determining the direction of the magnetic field and the strength of the magnetic field based on an altitude and a location of the spacecraft relative to the planet, or receiving data on the magnetic field.

20. The method of claim 15, further comprising deploying (1604) the ion blocker from the spacecraft in orbit of the planet.

* * * * *